(12) United States Patent
Wählisch

(10) Patent No.: US 10,459,342 B2
(45) Date of Patent: Oct. 29, 2019

(54) RADIATION SOURCE, LITHOGRAPHIC APPARATUS DEVICE MANUFACTURING METHOD, SENSOR SYSTEM AND SENSING METHOD

(71) Applicant: ASML Netherlands B.V., Veldhoven (NL)

(72) Inventor: Christian Felix Wählisch, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/247,094

(22) Filed: Jan. 14, 2019

(65) Prior Publication Data

US 2019/0146350 A1 May 16, 2019

Related U.S. Application Data

(63) Continuation of application No. 15/024,815, filed as application No. PCT/EP2014/069935 on Sep. 18, 2014, now Pat. No. 10,222,701.

(60) Provisional application No. 61/891,749, filed on Oct. 16, 2013.

(30) Foreign Application Priority Data

Jun. 3, 2014 (EP) .................... 14170928
Aug. 7, 2014 (EP) .................... 14180122

(51) Int. Cl.
  *G03F 7/20* (2006.01)
  *H05G 2/00* (2006.01)

(52) U.S. Cl.
  CPC ...... *G03F 7/70033* (2013.01); *G03F 7/70058* (2013.01); *G03F 7/70175* (2013.01); *G03F 7/70916* (2013.01); *H05G 2/005* (2013.01)

(58) Field of Classification Search
  CPC ............ G03F 7/70033; G03F 7/70175; G03F 7/70916; G03F 7/70058; H05G 2/005
  See application file for complete search history.

(56) References Cited

U.S. PATENT DOCUMENTS

| 4,245,999 A | 1/1981 | Reiniger |
| 4,541,772 A | 9/1985 | Becker |
| 7,525,635 B2 | 4/2009 | Van Den Wildenberg |
| 7,655,925 B2 | 2/2010 | Bykanov et al. |

(Continued)

FOREIGN PATENT DOCUMENTS

| EP | 1 039 137 | 9/2000 |
| EP | 1 496 263 | 1/2005 |
| JP | 2000-073986 | 3/2000 |

OTHER PUBLICATIONS

International Search Report and Written Opinion dated Mar. 24, 2015 in corresponding International Patent Application No. PCT/EP2014/069935.

(Continued)

*Primary Examiner* — Mesfin T Asfaw
(74) *Attorney, Agent, or Firm* — Pillsbury Winthrop Shaw Pittman, LLP

(57) ABSTRACT

A radiation source for a lithographic apparatus, in particular a laser-produced plasma source includes a fan unit surrounding but not obstructing the collected radiation beam that is operated to generate a flow in a buffer gas away from the optical axis. The fan unit can include a plurality of flat or curved blades generally parallel to the optical axis and driven to rotate about the optical axis.

20 Claims, 11 Drawing Sheets

(56) References Cited

U.S. PATENT DOCUMENTS

| | | |
|---|---|---|
| 7,952,084 B2 | 5/2011 | Soer et al. |
| 8,076,659 B2 | 12/2011 | Shirai et al. |
| 2004/0099820 A1 | 5/2004 | Bristol |
| 2004/0109151 A1 | 6/2004 | Bakker |
| 2005/0122491 A1 | 6/2005 | Bakker |
| 2006/0138348 A1 | 6/2006 | Bakker |
| 2006/0186353 A1 | 8/2006 | Wassink |
| 2007/0081889 A1 | 4/2007 | Engländer |
| 2008/0174751 A1 | 7/2008 | Van Den Wildenberg |
| 2009/0057567 A1 | 3/2009 | Bykanov et al. |
| 2009/0272916 A1 | 11/2009 | Soer et al. |
| 2011/0002569 A1 | 1/2011 | Derra et al. |
| 2013/0058783 A1 | 3/2013 | Fukuda |

OTHER PUBLICATIONS

S.S. Harilal et al., "Debris mitigation in a laser-produced tin plume using a magnetic field," J. Appl. Phys., vol. 98, pp. 036102-1-036102-3 (2005).

K. Takenoshita et al., "Debris studies for the tin-based droplet laser-plasma EUV source," Proc. of SPIE, vol. 5374, pp. 954-963 (2004).

Akira Endo, "Extendability of LPP EUV source technology in higher power (kW) / shorter wavelength (6.x nm) operation," Waseda University (Tokyo) and HiLase Project (Prague), 50 pages (Oct. 9, 2012).

Tomoya Akiyama et al., "Imaging Diagnostics of Debris from Double Pulse Laser-Produced Tin Plasma for EUV Light Source," J. Plasma Fusion Res. SERIES, vol. 8, pp. 496-499 (2009).

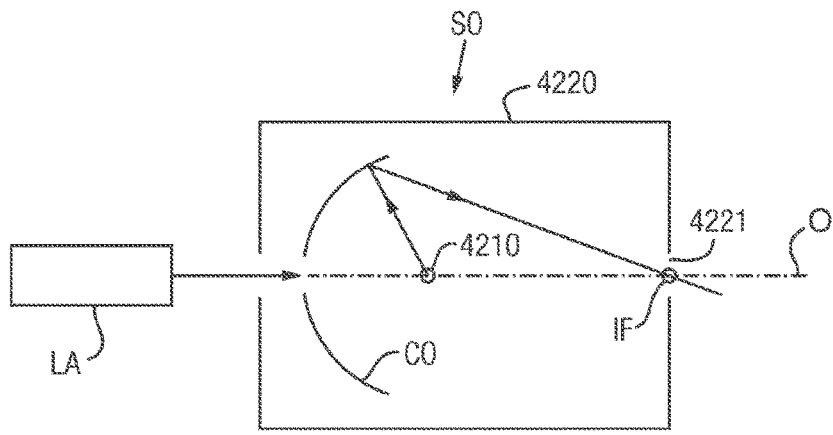
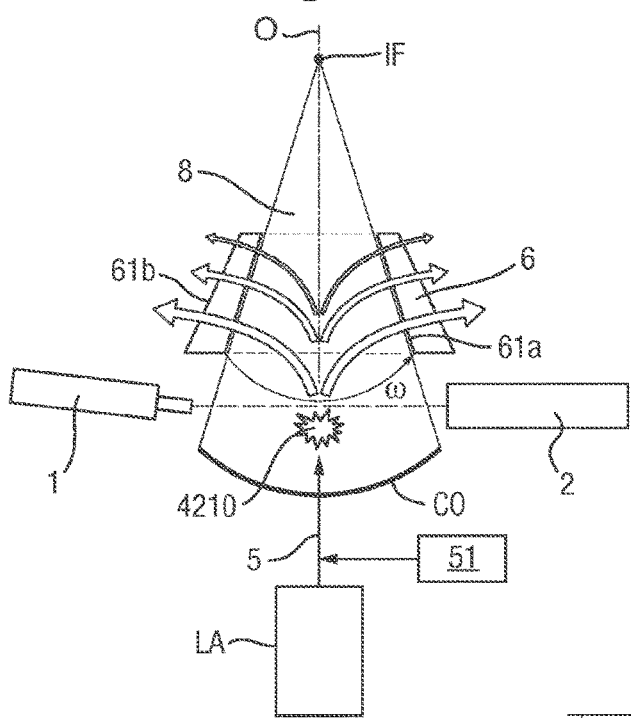
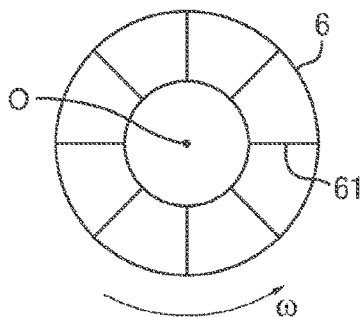
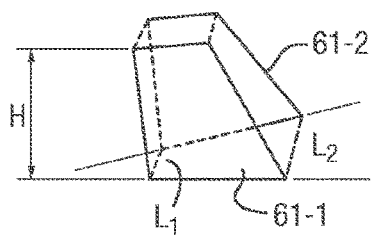

Fig. 20
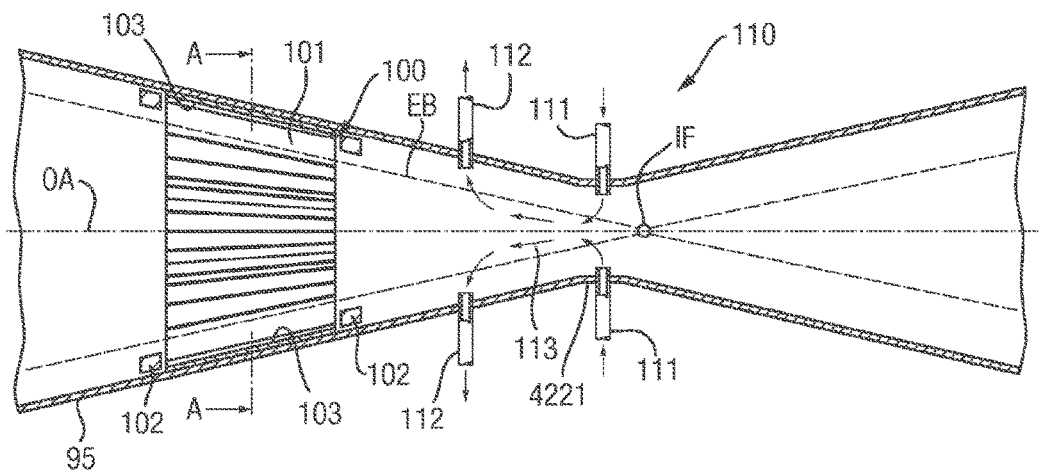
Fig. 21
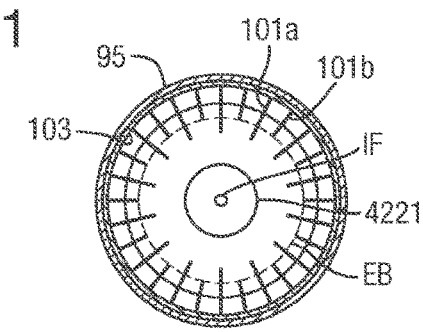
Fig. 22
Fig. 23
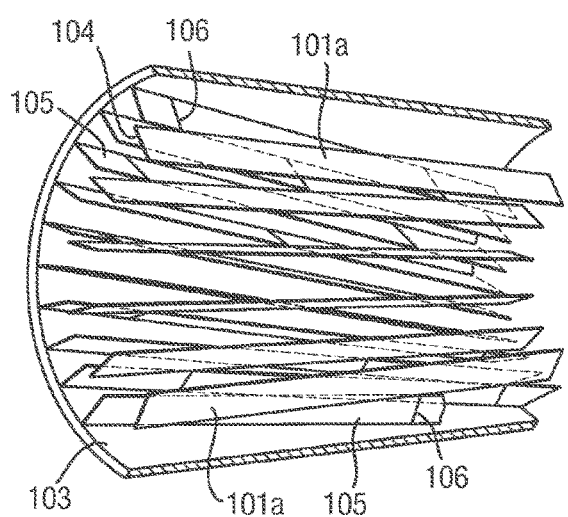

RADIATION SOURCE, LITHOGRAPHIC APPARATUS DEVICE MANUFACTURING METHOD, SENSOR SYSTEM AND SENSING METHOD

This application is a continuation of U.S. patent application Ser. No. 15/024,815, which was filed on Mar. 24, 2016, now allowed, which is the U.S. national phase entry of PCT patent application no. PCT/EP2014/069935, which was filed on Sep. 18, 2014, which claims the benefit of priority of U.S. provisional application No. 61/891,749, which was filed on Oct. 16, 2013, and of European patent application no. 14170928.7, which was filed on Jun. 3, 2014, and of European patent application no. 14180122.5, which was filed on Aug. 7, 2014, each of the foregoing applications is incorporated herein in its entirety by reference.

FIELD

The present invention relates to a radiation source, a lithographic apparatus, a device manufacturing method, a sensor system and a sensing method. In particular, the invention relates to a radiation source using a plasma to generate EUV radiation for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In order to reduce the size of the features of the circuit pattern, it is necessary to reduce the wavelength of the imaging radiation. To this end, lithographic apparatus using EUV radiation, e.g. having a wavelength in the range of from about 5 nm to 20 nm, are under development. EUV radiation is strongly absorbed by almost all materials, therefore the optical systems and mask must be reflective and the apparatus kept under a low pressure or vacuum.

SUMMARY

EUV radiation can be generated by forming a plasma of a suitable material, such that re-combination of free electrons with positive ions in the plasma results in emission of radiation of the desired wavelength. A plasma can be generated by laser irradiation of fuel or electrical discharge. A collector, e.g. in the form of a parabolic mirror, is used to collect the desired radiation and direct it to an intermediate focus in the entrance to an illumination system.

As well as the desired radiation, a plasma source emits radiation in other wavelengths and also physical debris such as ions, vapor and droplets of the fuel. The physical debris from the source can contaminate the collector, reducing its reflectivity and hence the amount of radiation available for imaging. If the physical debris is permitted to enter the illumination system, which forms the beam of radiation to illuminate the mask, it can cause various undesirable effects, such as contaminating the mirrors of the illumination system. Any such contamination would significantly reduce the transmission of the illumination system, reducing the throughput of the apparatus and the serviceable life of the illumination system.

Two different counter-measures are known to prevent debris from the plasma contaminating the collector and entering the illumination system. One is to provide a low-pressure flow of gas such as argon, nitrogen or hydrogen ($H_2$) around the collector to prevent debris settling thereon. The second is a set of rotating vanes located in the radiation beam between the plasma and the collector on the intermediate focus. See for example, United States patent application publication no. US 2009-0272916. The vanes are thin and oriented substantially parallel to the optical axis of the source module so that obstruction of the beam is minimized. The vanes rotate about an axis substantially parallel to the optical axis at a rate fast enough that the physical debris cannot pass through to the intermediate focus before being swept up by a vane. However, the present inventors have determined that these counter-measures are not sufficiently effective at preventing debris accumulating on the collector and/or entering the illumination system. Also, monitoring contamination of the optical system requires the apparatus to be switched off and opened up for inspection. This reduces the availability of the apparatus. Also, debris collects on the vanes requiring them to be changed frequently. Furthermore, such rotating vanes are usually located at a relative short distance to plasma position between the collector and the plasma formation site, for which reason the high heat load from plasma may melt the material of the vanes, such that they will not survive high EUV powers envisaged in the future.

Another disadvantage is that in the prior art rotating vanes or foils are positioned in the radiation beam and therefore they receive the radiation produced by the plasma. The amount of radiation leaving the exit aperture of the radiation source is thereby lowered and the vanes are thereby heated by the radiation such that the vanes may require cooling. The working of the radiation source is thereby deteriorated and/or complicated.

Therefore, it is desirable to provide a novel approach to preventing or ameliorating the deleterious effects of debris emitted by a plasma.

According to an aspect of the invention, there is provided a radiation source device, the device comprising: a source chamber having an exit aperture; a fuel source unit configured to provide fuel to the source chamber; an excitation unit configured to excite the fuel to form a plasma; a collector configured to collect at least radiation of a desired wavelength emitted by the plasma and to direct the collected radiation beam along a beam path out of the exit aperture of the source chamber; a buffer gas unit configured to supply buffer gas to the source chamber; and a fan unit located outside the beam path and configured to generate a flow of the buffer gas away from the collector and/or the exit aperture. The desired wavelength may be for example EUV radiation having a wavelength in the range of from about 5 nm to 20 nm.

According to an aspect of the invention there is provided a radiation source device, the device comprising: a source chamber having an exit aperture; a fuel source unit configured to provide fuel to the source chamber; an excitation unit configured to excite the fuel to form a plasma; a collector configured to collect at least radiation of a desired wavelength emitted by the plasma and to direct the collected radiation beam along a beam path out of the exit aperture of the source chamber; and a particle trap located between collector and the exit aperture, the particle trap comprising a set of vanes, wherein: at least a part of each vane lies within the beam path, the part of each vane lies substantially on a plane containing an optical axis of the beam path, and the part of each vane extends towards but does not reach the optical axis.

According to an aspect of the invention, there is provided a lithographic tool comprising: a radiation source device as described above; and an optical system arranged to direct radiation emitted by the radiation source onto an object.

According to an aspect of the invention, there is provided a device manufacturing method comprising: exciting a fuel to form a plasma; collecting radiation emitted by the plasma and directing it into a beam; directing the beam onto a patterning device; directing the beam patterned by the patterning device onto a substrate; supplying a buffer gas to a chamber containing the plasma; and operating a fan located outside the beam path to generate a flow of the buffer gas out of the beam.

According to an embodiment of the invention, there is provided a sensor system for measuring a ballistic particle flux, the sensor system comprising: a sensor device configured to measure ballistic particles and environmental contamination incident thereon; and a shield configured to selectively prevent the ballistic particle flux reaching the sensor device but allow the environmental contamination to reach the sensor device.

According to an embodiment of the present invention, there is provided a method of sensing a ballistic particle flux in a place subject to environmental contamination, the method comprising: generating a sensor signal indicative of accumulation on a sensor device of matter deriving from the ballistic particle flux and the environmental contamination; generating a reference signal indicative of accumulation on the sensor device of matter deriving from environmental contamination but not the ballistic particle flux; and obtaining a value indicative of the ballistic particle flux from the sensor signal and the reference signal.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 is a more detailed view of the source collector apparatus of the apparatus of FIGS. 1 and 2;

FIG. 4 depicts a radiation source device according to an embodiment of the invention;

FIG. 5 depicts a fan unit according to an embodiment of the present invention in plan;

FIG. 6 is a diagram explaining dimension of a fan unit of an embodiment of the present invention;

FIG. 20 depicts in section a particle trap according to an embodiment of the invention;

FIG. 21 is an end view of the particle trap of FIG. 20;

FIG. 22 depicts a part of a particle trap according to a variant of the embodiment of FIG. 20;

FIG. 23 depicts in plan a part of the particle trap of FIG. 22;

DETAILED DESCRIPTION

Figure 1:
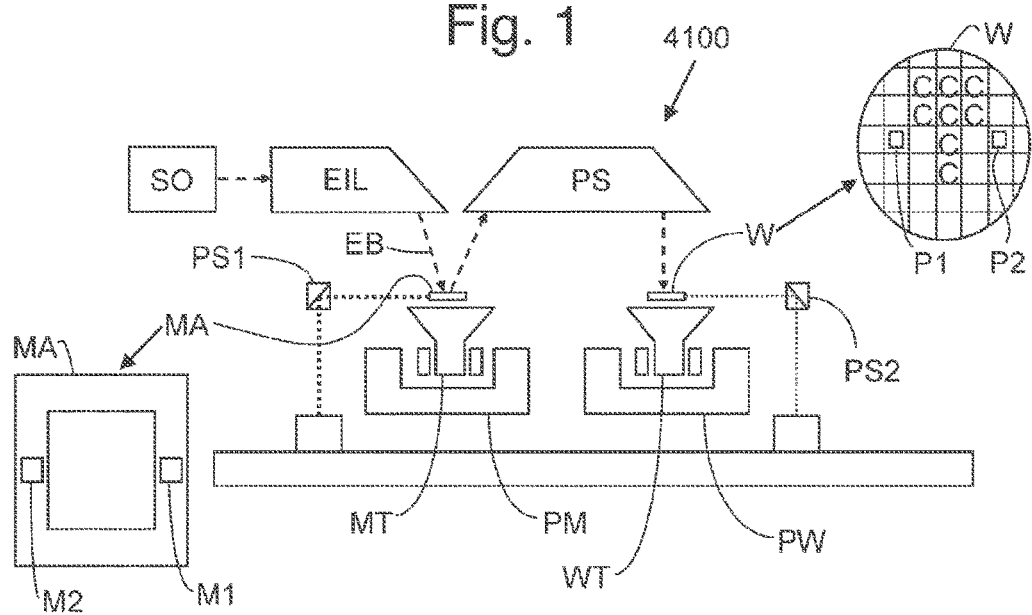
FIG. 1 depicts a lithographic apparatus used an embodiment of the invention.

FIG. 1 schematically depicts an EUV lithographic apparatus 4100 including a source collector apparatus SO (also named herein a radiation source device). The apparatus comprises:

an illumination system (illuminator) EIL configured to condition a radiation beam EB (e.g. EUV radiation);

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam EB by patterning device MA onto a target portion C (e.g. comprising one or more dies) of the substrate W.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The lithographic apparatus may be of a type having two or more substrate support structures, such as substrate stages or substrate tables, and/or two or more support structures for patterning devices. In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment of the invention one or more of the multiple substrate stages is replaced by a measurement stage. A measurement stage includes at least a part of one or more sensor systems such as a sensor detector and/or target of the sensor system but does not support a substrate. The measurement stage is positionable in the projection beam in place of a substrate stage or a support structure for a patterning device. In such apparatus the additional stages may be used in parallel, or preparatory steps may be carried out on one or more stages while one or more other stages are being used for exposure.

In an EUV lithographic apparatus, it is desirable to use a vacuum or low pressure environment since gases can absorb too much radiation. A vacuum environment can therefore be provided to the whole beam path with the aid of a vacuum wall and one or more vacuum pumps.

Referring to FIG. 1, the EUV illuminator EIL receives an extreme ultraviolet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the desired line-emitting element, with a laser beam. The source collector apparatus SO may be part of an EUV radiation system including a laser, not shown in FIG. 1, to provide the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the radiation beam is passed from the laser to the source collector apparatus with the aid of a beam delivery system comprising, for example, suitable directing mirrors and/or a beam expander. In other cases the source may be an integral part of the source collector apparatus, for example when the source is a discharge-produced plasma EUV generator, often termed as a DPP source.

The EUV illuminator EIL may comprise an adjuster to adjust the angular intensity distribution of the radiation beam EB. Generally, at least the outer and/or inner radial extent (commonly referred to as σ-outer and σ-inner, respectively) of the intensity distribution in a pupil plane of the illuminator can be adjusted. In addition, the EUV illuminator EIL may comprise various other components, such as facetted field and pupil mirror devices. The EUV illuminator EIL may be used to condition the radiation beam EB, to have a desired uniformity and intensity distribution in its cross section.

The radiation beam EB is incident on the patterning device (e.g., mask) MA, which is held on the support structure (e.g., mask table) MT, and is patterned by the patterning device. After being reflected from the patterning device (e.g. mask) MA, the radiation beam EB passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam EB. Similarly, the first positioner PM and another position sensor PS1 can be used to accurately position the patterning device (e.g. mask) MA with respect to the path of the radiation beam EB. Patterning device (e.g. mask) MA and substrate W may be aligned using mask alignment marks M1, M2 and substrate alignment marks P1, P2.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A control system (not shown) controls the overall operations of the lithographic apparatus and in particular performs an optimization process described further below. The control system can be embodied as a suitably-programmed general purpose computer comprising a central processing unit and volatile and non-volatile storage.

Figure 2:
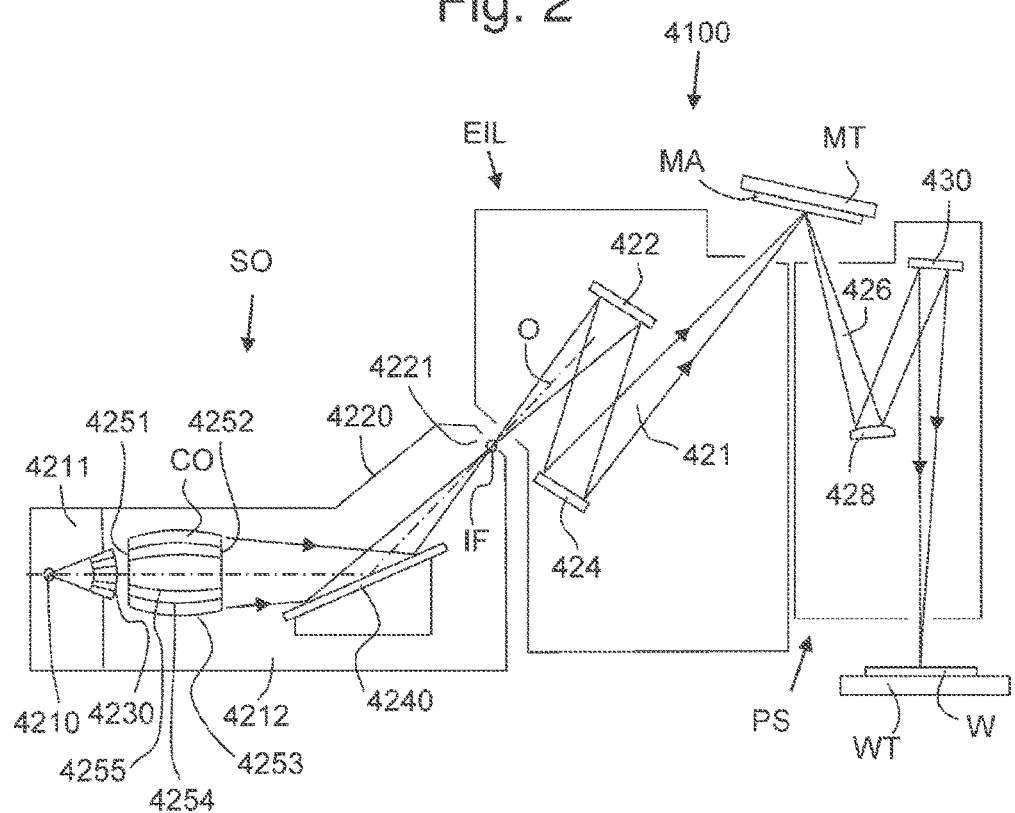
FIG. 2 is a more detailed view of the apparatus of FIG. 1.

FIG. 2 shows the EUV apparatus 4100 in more detail, including the source collector apparatus SO, the EUV illumination system EIL, and the projection system PS. The source collector apparatus SO is constructed and arranged such that a vacuum environment can be maintained in an enclosing structure 4220 of the source collector apparatus SO. An EUV radiation emitting plasma 4210 may be formed by a discharge produced plasma source. EUV radiation may be produced by a gas or vapor, for example Xe gas, Li vapor or Sn vapor in which the plasma 4210 is created to emit radiation in the EUV range of the electromagnetic spectrum. The plasma 4210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the plasma 4210 is passed from a source chamber 4211 into a collector chamber 4212 via an optional gas barrier and/or contaminant trap 4230 (in some cases also referred to as contaminant barrier or foil trap) which is positioned in or behind an opening in source chamber 4211. The contaminant trap 4230 may include a channel structure. Contamination trap 4230 may also include a gas barrier or a combination of a gas barrier and a channel structure. The contaminant trap or contaminant barrier 4230 further indicated herein at least includes a channel structure, as known in the art.

The collector chamber 4212 may include a radiation collector CO which may be a so-called grazing incidence collector. Radiation collector CO has an upstream radiation collector side 4251 and a downstream radiation collector side 4252. Radiation that traverses collector CO can be reflected by a grating spectral filter 4240 to be focused in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system EIL, which may include a facetted field mirror device 422 and a facetted pupil mirror device 424 arranged to provide a desired angular distribution of the radiation beam 421, at the patterning device MA, as well as a desired uniformity of radiation intensity at the patterning device MA. Upon reflection of the beam of radiation 421 at the patterning device MA, held by the support structure MT, a patterned beam 426 is formed and the patterned beam 426 is imaged by the projection system PS via reflective elements 428, 430 onto a substrate W held by the substrate stage or substrate table WT.

More elements than shown may generally be present in illumination optics unit IL and projection system PS. The grating spectral filter 4240 may optionally be present, depending upon the type of lithographic apparatus. There may be more mirrors present than those shown in the Figures, for example there may be from 1 to 6 additional reflective elements present in the projection system PS than shown in FIG. 2.

Collector optic CO, as illustrated in FIG. 2, is depicted as a nested collector with grazing incidence reflectors 4253, 4254 and 4255, just as an example of a collector (or collector mirror). The grazing incidence reflectors 4253, 4254 and 4255 are disposed axially symmetric around an optical axis O and a collector optic CO of this type is preferably used in combination with a discharge produced plasma source, often called a DPP source.

Alternatively, the source collector apparatus SO may be part of an LPP radiation system as shown in FIG. 3. A laser LA is arranged to deposit laser energy into a fuel, such as xenon (Xe), tin (Sn) or lithium (Li), creating the highly ionized plasma 4210 with electron temperatures of several 10's of eV. The energetic radiation generated during de-excitation and recombination of these ions is emitted from the plasma, collected by a near normal incidence collector optic CO and focused onto the opening 4221 in the enclosing structure 4220, also known as the source chamber.

In this radiation system, the plasma 4210 emits out of band radiation and physical debris, such as ions and atoms of the fuel and larger droplets as well as other desired EUV radiation. It is necessary to prevent the accumulation of material on the collector and also to prevent physical debris exiting the source chamber 4220 and entering the illumination system. Known proposals include the provision of a low pressure atmosphere of gas within the source chamber 4220 that impedes travel of fast debris particles from the source whilst being thin enough to minimize absorption of the desired EUV radiation. It has also been proposed to provide an arrangement of rotating foils between the plasma 4210 and collector CO. The foils are arranged parallel to a rotation axis which generally coincides with the beam axis and are thin to minimize absorption of the desired EUV radiation. The foils are driven to rotate at a speed sufficient that a debris particle cannot pass through the foil trap without being swept up by one of the foil vanes. These arrangements however do not provide sufficient protection for sources of increased power which are desirable to increase the throughput of the apparatus. Therefore, an alternative approach is desired.

FIG. 4 depicts a radiation source device according to an embodiment of the invention including a novel debris mitigation arrangement. In the radiation source, droplets of a fuel, e.g. Sn (Tin), are emitted by droplet generator 1, which functions as a fuel source unit, and are irradiated by pulses of light from laser LA to generate plasma 4210. Plasma 4210 emits the desired EUV radiation as well as other radiation and physical debris as discussed above. The majority of the fuel material is collected by droplet catcher 2 but the physical debris emitted in other directions is still sufficient to degrade the lifetime of the collector and to contaminate the illumination system. To mitigate this, a buffer gas 5 is supplied from buffer gas supply 51 (which functions as a buffer gas unit) through the aperture in collector CO by which the laser pulse is delivered to the fuel. In an embodiment, the buffer gas is $H_2$, He, Ar, N or another inert gas. H radicals, e.g. for cleaning purposes, can also be provided or can be generated by ionization of the buffer gas. The buffer gas can also be provided through other apertures in the collector (not shown) and/or around the edges of the collector.

The present inventors have found that supply of the buffer gas through the collector is not in itself sufficient to reduce debris accumulation on the collector to an acceptable level for a high-power source and does not sufficient inhibit transport of debris into the illumination system. According to the invention, a fan unit is provided outside the radiation beam to create a flow in the buffer gas sufficient to mitigate the deleterious effects of debris on the collector and illumination system. The fan unit of the invention is arranged to perform at least one of the following functions: generate a gas flow away from the optical axis of the source module, pump gas, guide or collect particles, reduce or prevent contamination from spitting particles, and reduce or prevent gas flow towards the collector. In particular, in an apparatus with a buffer gas flow around the collector, a recirculating flow can arise that, although initially taking contaminants away from the center of the collector, actually brings contaminants to the collector at its edges. An embodiment of the invention is arranged to ensure that such a recirculating or back flow does not arise and gas flow from the vicinity of the collector is directed well away.

In the embodiment of FIG. 4 the fan unit 6 comprises an annular arrangement of a plurality of blades 61 forming a blade assembly which is rotatable about an optical axis of the beam path, as shown in plan in FIG. 5. The fan unit 6 is driven to rotate with angular velocity ω about the optical axis O so that a flow of the buffer gas away from the optical axis O is created. Blades 61 are mounted radially, parallel to the optical axis O. Optionally in an embodiment the blades are generally flat, i.e. planar. The inner edge 61a of each blade is at an angle to the optical axis O so that the fan unit 6 defines an empty central space that is frustoconical in shape and closely surrounds but does not obstruct the radiation 8 collected by collector CO and directed towards intermediate focus IF. The outer edges 61b of each blade can also be angled so that the whole fan unit is generally frustoconical or may have another shape, e.g. being parallel to the optical axis so the fan unit as a whole is cylindrical.

Figure 7:
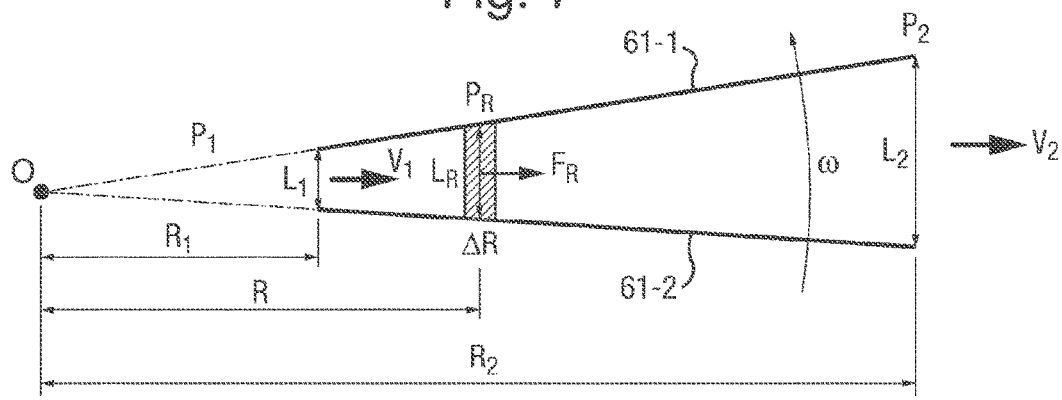
FIG. 7 is a diagram explaining a calculation of pressure difference and gas flow in an embodiment of the present invention.

Rotation of the fan unit about the optical axis O creates an outward flow in the buffer gas through centrifugal effects. The rotational frequency ω at which the fan unit is driven is determined by the size of the apparatus, the desired flow and the density of the gas within the chamber. Referring to FIGS. 6 and 7, a suitable rotational frequency can be calculated as set out below.

As shown in FIG. 6 the blades 61 have a height H in a direction parallel to the optical axis O, a separation $L_1$ at their inner edges and a separation $L_2$ at their outer edges. The distances $L_1$ and $L_2$ are determined by the number of blades N, the inner radius $R_1$ of the fan unit 6 and the outer radius $R_2$ thereof if the spacing is uniform, as in this embodiment. A uniform spacing of blades is not however essential to the invention. A volume of gas between two blades 61-1 and 61-2 at a distance R from the optical axis O and thickness ΔR has a mass m given by:

$$m = H \cdot \Delta R \cdot L_R \cdot \rho \quad (1)$$

where ρ is the density of gas in the chamber. The centrifugal force $F_x$ is given by:

$$F_x = \frac{mv^2}{R} = \frac{mR^2\omega^2}{R} = mR\omega^2 \quad (2)$$

and the pressure difference applied to this volume is given by:

$$dP_x = \rho\omega^2 R \Delta R \quad (3)$$

The total pressure difference ΔP between the volume in the center of the fan unit and the volume outside the fan unit is given by:

$$\Delta P = \int_{L_1}^{L_2} \rho\omega^2 R dR = \frac{1}{2}\rho\omega^2(R_2^2 - R_1^2) = 2\rho(\pi f)^2(R_2^2 - R_1^2) \quad (4)$$

Figure 8:
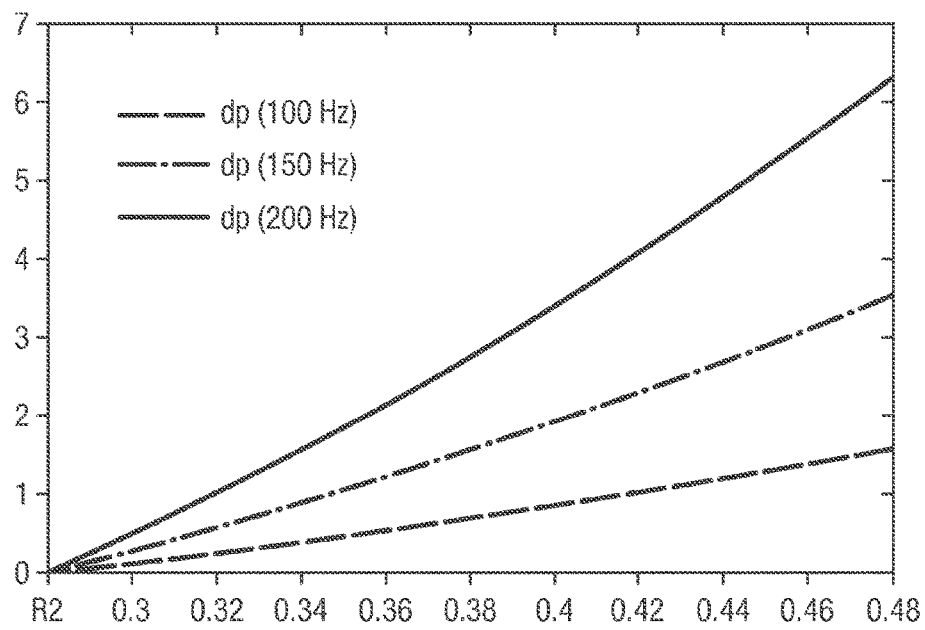
FIG. 8 depicts pressure difference with radius for different values of rotational frequency of a fan unit of an embodiment of the present invention.

For a pressure of 120 Pa of $H_2$ at 540 K the gas density is $5 \times 10^{-5}$ kg·m$^{-3}$. If the inner diameter of the radius is 0.3 m than the pressure difference in Pa for different outer radii in m and different rotational frequencies in Hz are shown in FIG. 8. In FIG. 8 the dashed line indicates the rotational frequency of 100 Hertz; dot-dash chain line indicates a rotation frequency of 150 Hertz and the solid line a rotational frequency of 200 Hertz. It will be seen that the pressure difference increases more than linearly with radius and more steeply the higher the rotational frequency. The velocity $V_1$ of the gas flow into the space between blades and the velocity $V_2$ of the gas flow out of the outer edges of the blades is driven by the pressure difference and related thereto by equation 5 below:

$$\Delta P = (\frac{1}{2}\rho V_2^2 + \rho g Z_2) - (\frac{1}{2}\rho V_1^2 + \rho g Z_1) \quad (5)$$

The pressure difference driven by the rotational speed is very much greater than the pressure difference driven by height whilst the flow resistance is also negligible so equation 5 can be simplified to give a value for $V_2$ in terms of $V_1$ as follows:

$$V_2 = \sqrt{(2\pi f)^2(R_2^2 - R_1^2) + V_1^2} \quad (6)$$

Figure 9:
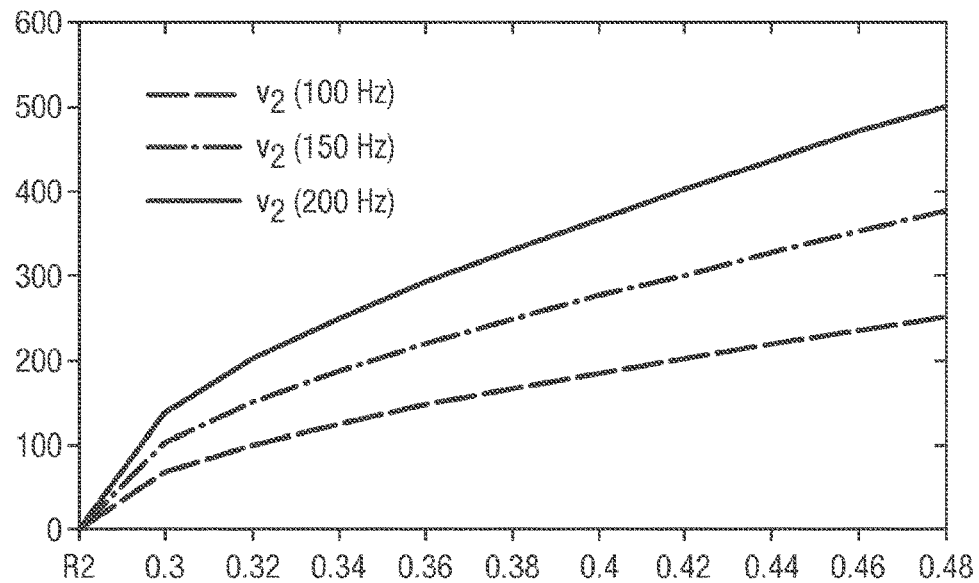
FIG. 9 depicts radial gas flow velocity with a radius at different rotational frequencies of a fan unit according to an embodiment of the present invention.

Assuming a negligible radial flow velocity at the origin then the velocity profiles in ms$^{-1}$ of the gas at different radii in m and different rotational frequencies in Hz are shown in FIG. 9. It will be seen that appreciable gas flows can easily be achieved.

In the prior art debris mitigation systems the fuel debris is mostly kept in the radiation source device. In the present invention the debris present in the form of particles, vapor, ions (such as tin debris) and other debris is pumped out of the radiation source device. Some of the fuel debris that is drawn away from the beam by the gas flow is collected on the surfaces of the blades 61 of the fan unit. Other debris is removed from the chamber with the buffer gas, which is pumped out and in some embodiments, cleaned and recirculated. Some debris is propelled radially out of the fan unit and collects on the walls of the vacuum chamber. Specific structures to collect fuel debris can be provided. Collected fuel can be recycled.

Figure 10:
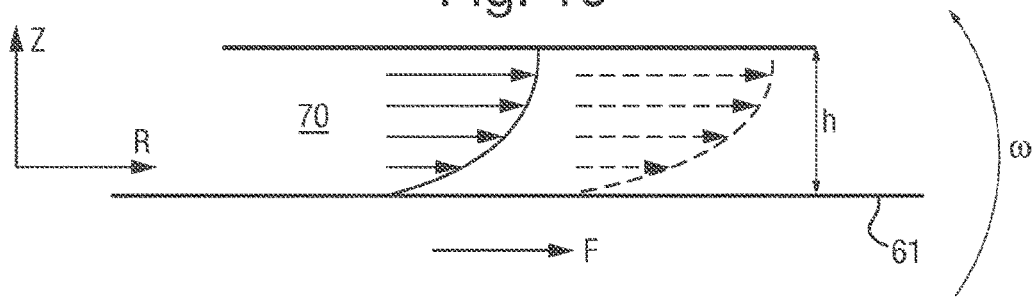
FIG. 10 is a diagram used to explain calculations of the flow velocity of a tin layer in an embodiment of the present invention.

Fuel debris might build up on the blades over time. By suitable choice of rotational speed (i.e. rotational velocity), it can be arranged that fuel debris that falls on the blades is driven off by the centrifugal force. This will occur if the Taylor number Ta is greater than 1. Ta is given by:

$$Ta = \frac{4\rho^2 \omega^2 R^4}{\mu^2} \qquad (8)$$

Where μ is the viscosity of the fuel, e.g. 0.0018 Pa·s for liquid tin, ρ is the density of the fuel, e.g. 6990 kg·m$^{-3}$ for liquid tin, ω=2πf is the angular velocity, and R is the rotational radius. In the case of tin as the fuel, a rotational frequency of 50 Hz is more than sufficient to cause a flow of tin outwardly of the blades. 61. Assuming a layer of molten tin of thickness h, as shown in FIG. 10, the velocity u of the surface of the tin can be calculated as:

$$u = \frac{\rho \omega^2 R}{2\mu} z(2h - z) = \frac{\rho(2\pi f)^2 R^3}{2\mu} z(2h - z) \qquad (9)$$

For a thin film of thickness 10$^{-6}$ m, a rotational frequency of 50 Hz and R=0.3 m, the free surface velocity is 191 ms$^{-1}$. This is sufficient to prevent accumulation of the tin on the surfaces of the blades.

If the fuel is a solid at the operating temperature of the apparatus, as is normally the case for tin, a heating unit (not shown) can be provided to heat the blades to ensure that the fuel remains molten. The heating unit can comprise a current source to pass a current through the blades or through heating elements attached to the blades. Alternatively or in addition, the heating unit can comprise a microwave source or a radiant heating device. The heating unit can be operated continuously or intermittently, e.g. controlled by a timer system, a thermostat or by the machine operator. In an embodiment, solid fuel is allowed to accumulate for a predetermined period or until a predetermined amount has built up, and then the heating unit is operated while the fan unit is rotating to melt and remove the accumulated solid fuel. The amount of fuel accumulated on the blades can be measured by measuring the acceleration of the blade unit in response to application of a known drive force. The removal of accumulated fuel can be performed during operation of the apparatus to manufacture devices, during mask and/or substrate exchange process, and/or during maintenance of the apparatus.

Figure 11:
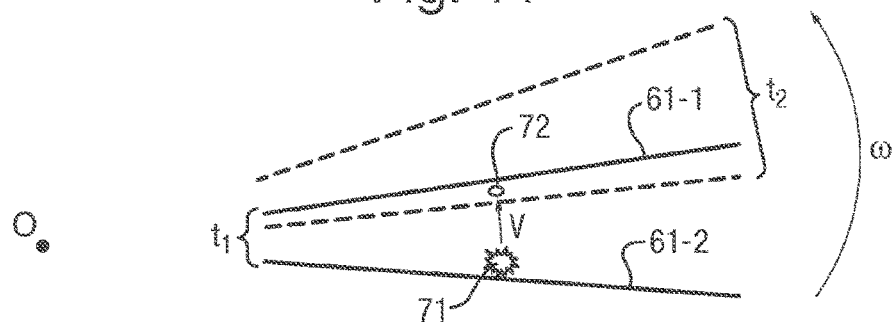
FIG. 11 is a diagram used to explain capturing of debris caused by spitting.

A phenomenon known as spitting can occur if droplets 71 of molten fuel accumulate on the blades. The buffer gas can diffuse into the droplets and form bubbles therein. These bubbles can migrate to the surface of the droplets and burst, expelling small particles or droplets 72 of the fuel. To ensure that any such particles or droplets 72 are captured by another blade of the fan unit, the rotational frequency f should be selected such that:

$$2\pi f R > v \qquad (10)$$

where v is the maximum velocity of the particle or droplet and R s the radius at which the spitting event occurred, as shown in FIG. 11. This takes into account the movement of blades 61-1 and 61-2 from their positions at time $t_1$ (solid lines) to their positions at time $t_2$ (dashed lines). Inverting inequality 10, we have:

$$f > \frac{v}{2\pi R} \qquad (11)$$

For a spitting velocity of 100 ms$^{-1}$ at a radius of 0.3 m a rotational frequency of 53 Hz is required, which is readily achievable.

Figure 12:
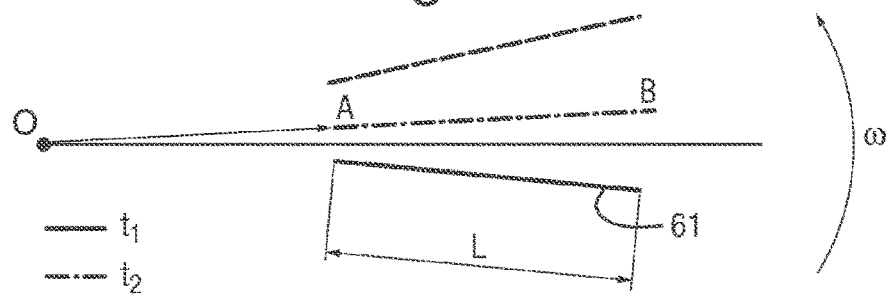
FIG. 12 is a diagram used to explain capture of debris using flat blades.

Another consideration in the selection of the rotational speed of the fan unit and the number of blades in it is to ensure that high velocity debris is captured by a blade, rather than passing through the fan unit. Capture of such debris is desirable as otherwise it can ricochet in the vacuum chamber and impact the collector, even if not originally going towards the collector. To ensure capture of debris of velocity $U_{debris}$ the travel time of the debris through from A to B in FIG. 12 the fan unit must be greater than the time interval between consecutive blades sweeping across a given point, referred to as the blade rotational period. Referring to FIG. 12, the travel time of the debris is given by:

$$t_{debris} = \frac{L_{plates}}{U_{debris}} \qquad (12)$$

and the blade rotational period is:

$$t_{plates} = \frac{1}{Nf} \qquad (13)$$

where N is the number of blades. Thus, we have:

$$f > \frac{U_{debris}}{NL} \qquad (14)$$

For debris with a velocity of 600 ms$^{-1}$ and blades of length 0.2 m, we can select a rotational frequency of 150 Hz or more and a number of blades of greater than 200 to ensure capture. In many cases the debris velocity will be much less than 600 ms$^{-1}$ so lower rotational frequencies and/or shorter blades can be employed.

Figure 13:
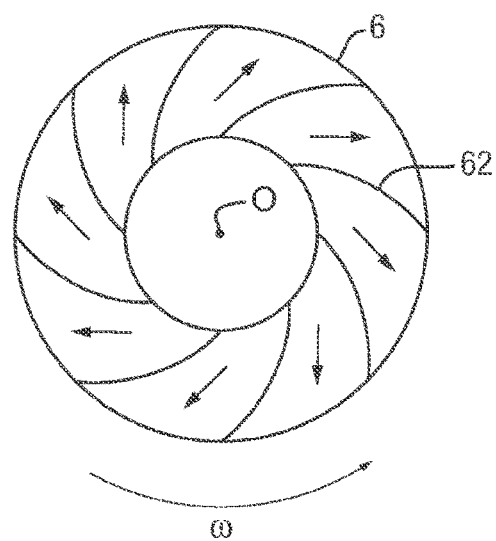
FIG. 13 is a plan view of a fan unit according to an embodiment of the present invention.

Another fan unit useable in an embodiment of the present invention is shown in FIG. 13. This differs from the fan units described above in that the blades 62 are curved rather than substantially planar. Other features, dimensions and materials of the fan unit are the same as in other embodiments described above. Curvature of the blades can enhance the generated flow of gas and/or the control of particulate debris. Use of curved blades can allow the fan units to be rotated at a lower speed and/or reduced in size.

Figure 14:
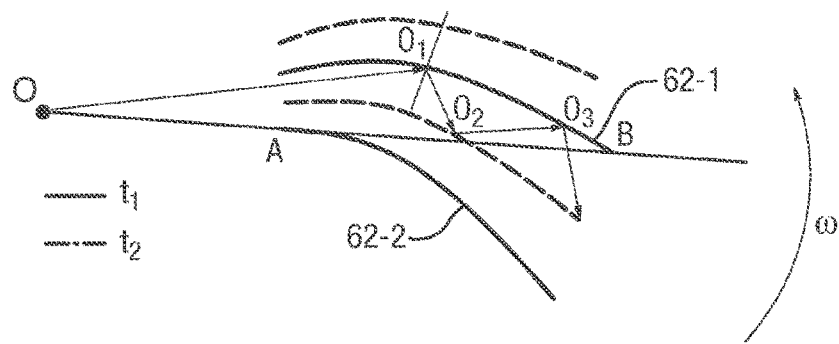
FIG. 14 is a diagram used to explain blade curvature in the embodiment of FIG. 13.

As shown in FIG. 14, the curvature of the blades 62 is desirably selected so that there is no straight path from the optical axis O and perpendicular thereto that passes through the fan unit without contact at least one of the blades 62-1 or 62-2. This ensures that a fast particle from the plasma cannot pass through the fan unit without contacting a blade of the fan unit at least once. If a particle of debris contacts a blade of the fan it is likely to be captured and if not captured slowed down.

A further consideration in selecting the shape of the curvature of the blades is to ensure that a high-speed particle that collides with a blade and bounces off is not reflected back towards the optical column. To achieve this, it is desirable that the shape of the blades be selected such that on the concave side of each blade at a given point the angle between the normal to the blade surface and a line from that point to the optical axis and perpendicular thereto is not less than 45°.

Figure 15:
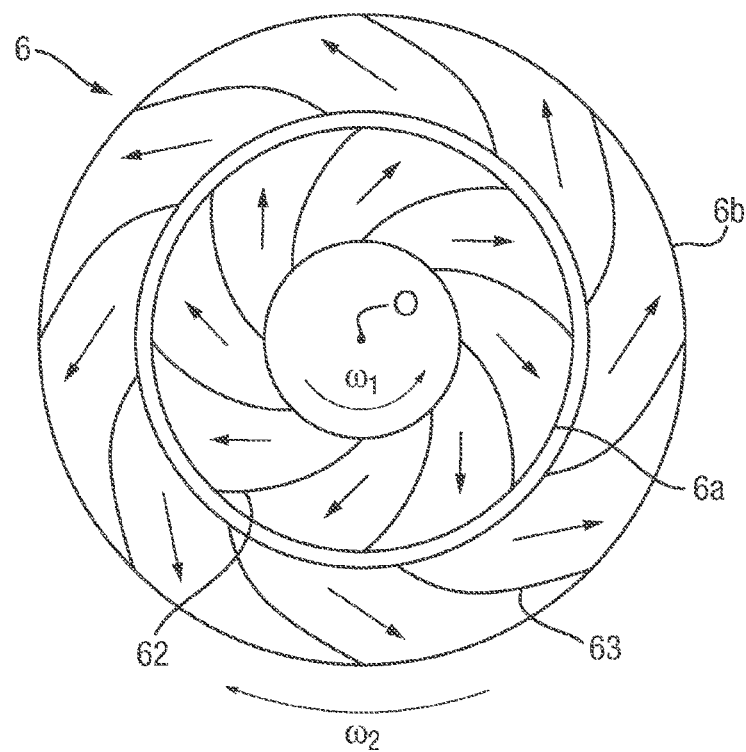
FIG. 15 is a plan view of an embodiment of the present invention having concentric fan units.

As shown in FIG. 14, in an embodiment with curved blades 62-1 and 62-2 that move from positions shown in solid line at time $t_1$ to positions shown in dashed line at time $t_2$, a particle leaving the optical axis O might make several collisions at positions 01, 02 and 03 with front and back surfaces of adjacent blades A further embodiment of a fan unit 6 is shown in FIG. 15. In this embodiment there are two blade units 6A, 6B arranged concentrically about the optical axis O. In such an arrangement, the inner and outer fan units can be driven to rotate at angular velocities $\omega_1$ and $\omega_2$. In an embodiment $\omega_1$ and $\omega_2$ are different. In an embodiment the inner and outer fan units 6A, 6B are driven to rotate in opposite senses. In an embodiment, more than two concentric fan units are provided, such as a plurality of concentric blade assemblies. The use of multiple concentric fan units can further enhance gas flow and debris collection whilst minimizing vibration.

In an embodiment of the invention utilizing curved blades, the curvature of the blades need not be uniform or continuous. The term "curved" should be construed as encompassing structures having abrupt bends or steps as well as continuous or gradual curvature.

Figure 16:
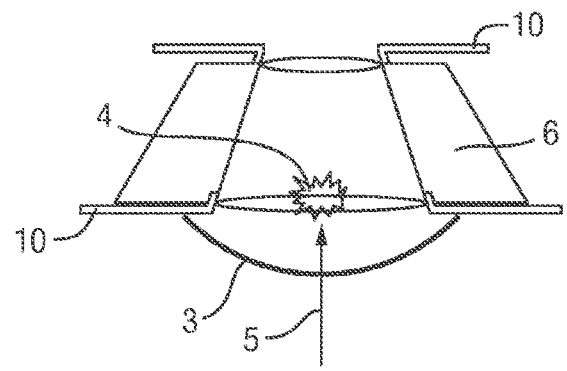
FIG. 16 depicts a fan unit according to an embodiment of the present invention showing a bearing.

FIG. 16 depicts a bearing system 10 which can be applied to any of the above described embodiments. Desirably the bearing system 10 supports the fan unit 6 at both ends thereof. An embodiment of the invention has a bearing system to support the fan unit at only one end. In an embodiment of the invention, the bearing system is desirably non-contact, e.g. a magnetic bearing or gas bearing. A gas bearing can employ the buffer gas or another inert gas such as He or Ar. Bearing system 10 is in an embodiment of the invention mounted to the wall of the vacuum chamber. In an embodiment of the invention, the fan unit is driven to rotate by an electric motor with permanent magnets built into the rotating fan unit and magnetic coil units mounted to the bearing system. The components of the motor system and the bearing are located outside of the path of the radiation beam. Desirably, the fan unit is driven to rotate at constant speed to minimize vibrations in the apparatus. Accelerations and decelerations of the fan unit can be controlled to minimize vibrations and to be performed at times coordinated with other activities on the apparatus so that vibration during exposures is minimized.

Figure 17:
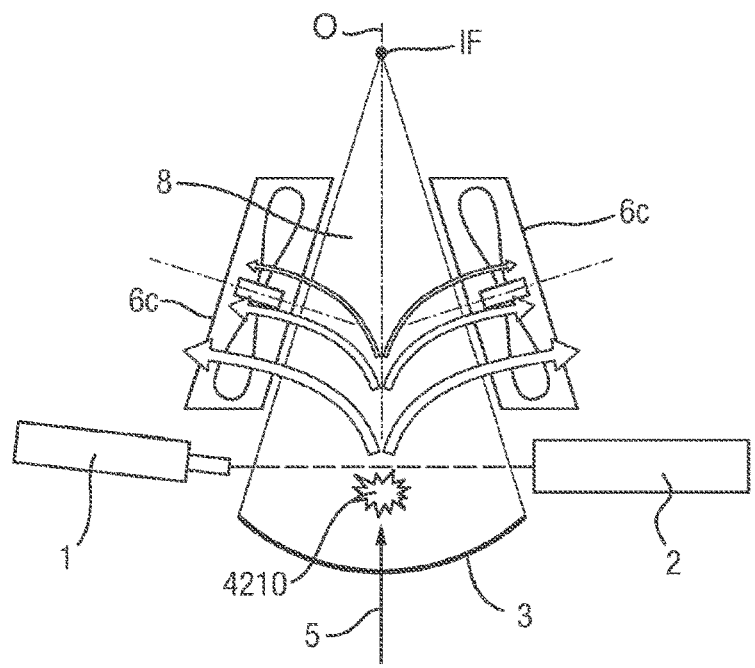
FIG. 17 depicts an embodiment of the present invention.

A further embodiment of the present invention is shown in FIG. 17. In this embodiment, multiple non-concentric fan units 6c are arranged around the collected radiation beam 8. Fan units 6c have axes of rotation that are not parallel or coincident with the optical axis O but rather directed generally perpendicular to the edges of the collected radiation beam 8. In an embodiment of the present invention where the distribution of debris from the plasma 4210 is non-uniform, the size and position of fan units 6c can be selected so that they are positioned in areas where there is most debris.

Figure 18:
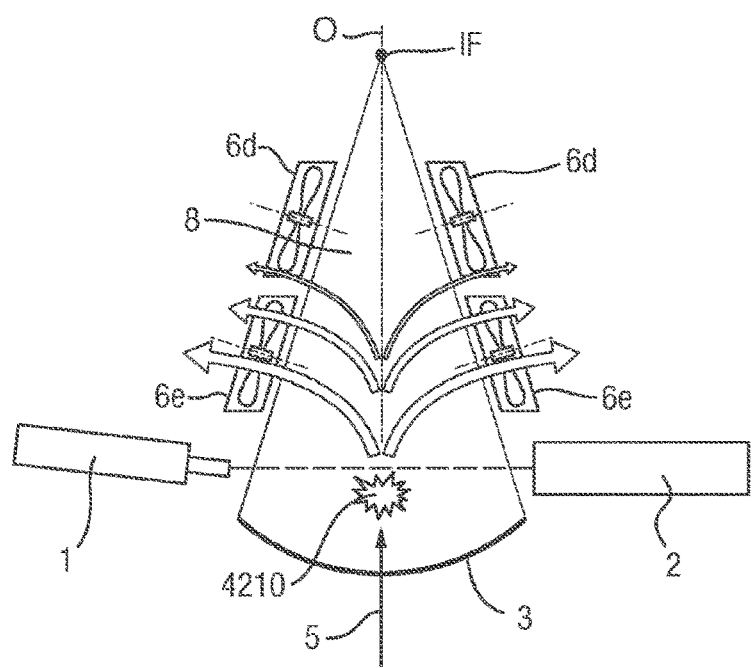
FIG. 18 depicts an embodiment of the present invention.

A further embodiment of the present invention is shown in FIG. 18. This embodiment comprises a plurality of rows of fan units 6d, 6e with some fan units 6d placed nearer the intermediate focus IF and some fan units 6e placed nearer the plasma 4210.

Taking into account the considerations discussed above, in an embodiment of the invention the rotational frequency of the fan is desirably in the range of from 50 to 200 Hertz, preferably from 60 to 150 Hertz, more preferably from 70 to 100 Hertz.

The inner radius of the fans at the end closest to the point of plasma generation can be in the range of from 0.1 m to 0.5 m, desirably in the range of 0.2 m to 0.4 m. The outer diameter of the fan unit at the end closest to the point of plasma generation can range from 0.4 m to 0.8 m, desirably between 0.4 m and 0.6 m.

Figure 19:
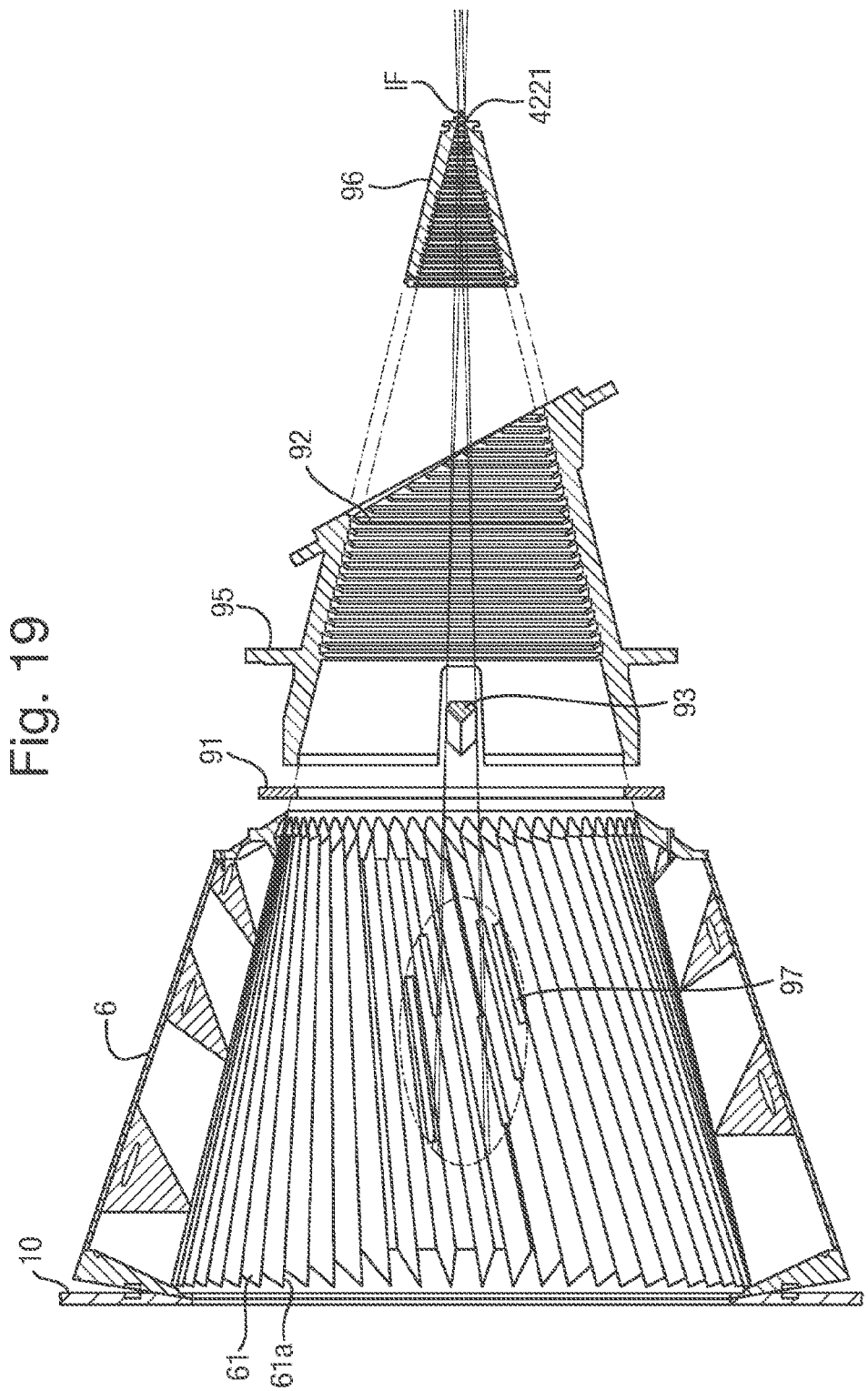
FIG. 19 depicts parts of a radiation source device according to an embodiment of the invention.

A further embodiment of the present invention is depicted in FIG. 19, which shows only selected parts of the radiation source device. Other components not depicted in FIG. 19 or mentioned below can be the same as relevant components of the embodiments described above.

FIG. 19 depicts a fan unit 6 according to an embodiment of the present invention and the exit cone 95 of source chamber 4220. The exit cone 95 has the shape of a cone tapering towards exit aperture 4221, just outside of which is located the intermediate focus IF. The radiation collected by collector CO is directed to intermediate focus IF as discussed above. Exit cone 95 includes additional debris mitigation elements to assist in preventing any debris that might have passed through fan unit 6 from exiting the radiation source device. Such additional particle mitigation elements may include ribs 92 provided on the interior walls of exit cone 95. Ribs 92 are configured to prevent any fast moving particles that collide with the interior walls of exit cone 95 from ricocheting towards the exit aperture 4221. The additional debris mitigation elements may also include crossbar 93 which spans across exit cone 95 near its wider end. Crossbar 93 is configured and arranged to obstruct the direct line of flight between plasma 4210 and the intermediate focus IF so as to prevent particles emitted by plasma 4210 travelling directly to exit aperture 4221. Desirably, crossbar 93 is located as close as possible to plasma 4210 in order to minimize the amount of useful radiation that it obstructs.

In spite of the fan unit of the present invention and the additional debris mitigation measures placed in the exit cone, some debris from the plasma 4210 can still leave the radiation source device and enter the remainder of the lithographic apparatus. Detailed investigations by the present inventors have determined that a likely source of at least some particulate debris leaving the radiation source device is particles that have bounced, or ricocheted, from the innermost edges 61a of the vanes 61 of fan unit 6. The innermost edges, which can also be referred to as the distal edges, of vanes 61 are the edges that are closest to the optical axis of the radiation beam EB directed by collector CO to intermediate focus IF. Although the distal edges 61a are narrow, the combined surface area of all the edges of all the blades is sufficiently large that ricocheting particles can form a significant contribution to debris exiting the cone.

In particular, the inventors have determined that a large fraction of the particles that leave the exit aperture have been deflected from a specific region, referred to herein as the deflection region 97. The location of the deflection region depends in a specific embodiment on the relative sizes and arrangements of the plasma and the exit aperture 4221 and how the fuel is irradiated. Bearing in mind that the fan unit 6 rotates at high speed during use of the apparatus, the deflection region 97 can be regarded as a region of a virtual surface that is the locus of the distal edges 61a of blades 61 as they rotate. The deflection region may correspond to or include the region of the virtual surface within which a particle incident directly from the plasma is deflected onto a trajectory that would take it out of the exit aperture 4221. In other words a single bounce or ricochet from the edge of a blade is sufficient to direct a particle emitted by the plasma onto a trajectory aimed at the exit aperture. However, it is also possible that a particle will make multiple bounces before exiting through the exit aperture. Therefore, the deflection region can be larger than the region of origin of single bounce particles.

In an embodiment, the deflection region 97 can be approximated geometrically by considering straight lines leaving the region in which the plasma is generated towards the fan unit and determining whether a specular reflection at the virtual surface leaves to a straight path exiting the exit aperture 4221. The blade may be configured such that all straight lines between a predetermined section of a distal edge of the blade and the intermediate focus are obstructed, the distal edge being the edge closest to the beam path. The predetermined section of the distal edge may include all parts of the edge at which a particle incident thereon directly from the plasma is deflected onto a trajectory aimed at the exit aperture. In an example the predetermined section includes the whole of the distal edge. This process can be performed automatically using a conventional ray tracing program. Assuming a specular reflection at the virtual cylinder or cone amounts to an assumption that a collision between a particle and a blade is perfectly elastic. Inelastic collisions can be modeled by assuming non-specular reflection at the deflection region, which is equivalent to diffraction at the virtual surface.

In an embodiment of the present invention, the radiation source device, in particular the fan unit, is configured such that all straight paths from the deflection region 97 to the exit aperture 4221 are obstructed. Such paths are referred to herein as particle exit paths. If such a condition is met, the deflection region 97 cannot be seen from the intermediate focus IF. Such obstruction can be effected at least in part by existing debris mitigation elements such as crossbar 93, or by the shape of the exit cone. In an embodiment, the obstruction of all particle exit paths can be effected by suitable choice of the inner diameter of fan unit 6. Ensuring obstruction of all particle exit paths may require an increase in the inner diameter of the fan unit 6 than might be considered optimum if this constraint were not taken into account.

In an embodiment of the present invention, the shape of the edges of the blades is determined to ensure that single and/or multiple bounce paths do not lead out of the exit aperture 4221. This can result in the edges of the blades having a curved shape, so that their locus of rotation is no longer a cylinder or cone. Alternatively or additionally, the edges can be given a wavy or saw-toothed profile so as to scatter particles bouncing there off.

In an embodiment of the present invention, an annular blocking member 91 is provided between the fan unit 6 and the exit aperture 4221. The annular blocking member may be configured so as to obstruct at least one straight line between at least a part of the distal edge and the intermediate focus. Annular blocking member 91 has an inner diameter that is as close as possible to the outer circumference of the light cone or beam path. Annular blocking member 91 extends outwardly to a diameter greater than the inner diameter of the fan unit 6 at its downstream end in order to block straight paths from blades of the fan unit to the exit aperture 4221. Blocking member 91 may be made of a material with a high melting point, such as molybdenum, in order to withstand the environment of the radiation source device. Blocking member 91 may be heated to prevent fuel debris accumulating thereon, in which case a drain can be provided at a lower region of annular blocking member 91 to collect fuel debris. Alternatively, annular blocking member 91 can be cooled so that fuel debris solidifies thereon, in which case blocking member 91 is desirably removable or interchangeable for cleaning purposes.

In an embodiment of the present invention, obstructive measures such as those described above can be extended to ensure that all straight paths from all parts of the distal edges of blades 61a to the exit aperture 4221 are obstructed i.e. not just paths from the deflection region. This further reduces escape of particulate debris from the exit aperture 4221 by preventing particles that have made more than one bounce from exiting the aperture. Such multiple bounce particles may have bounced off more than one blade, off the fan unit or off another part of the radiation source device prior to bouncing off a blade of the fan unit 6. The basic principle of this embodiment, that obstructions are placed in any path that a particle could otherwise follow to exit the source with a single bounce, can also be applied in other radiation source devices, e.g. not using a fan unit 6

A further embodiment of the present invention is depicted in FIGS. 19 and 20. This embodiment concerns an additional debris mitigation element provided in the exit cone 95 of the radiation source device. Other components of the radiation source device can be the same as the corresponding components of the embodiments described above. FIG. 20 depicts the further embodiment in cross section through the optical axis OA of the projection beam PB whilst FIG. 21 shows the parts of the apparatus in cross section along the line A-A looking towards the intermediate focus.

As discussed in relation to the embodiment of FIG. 19, some particles and other debris emitted by the plasma 4220 can get past the fan unit 6 and exit the radiation source device through exit aperture 4221. This is undesirable. The present inventors have determined through analysis of debris detected in other parts of the lithographic apparatus that a significant part of the debris that gets past the fan unit 6 travels close to the edges of the exit cone 95. A dynamic gas lock 110 provided close to the exit aperture 4221 is not sufficient to prevent such particles exiting the exit aperture 4221. A dynamic gas lock comprises gas outlets 111 provided in or near the exit aperture 4221 and gas outlets 112 provided in the exit cone 95. A flow of buffer gas, such as hydrogen or an inert gas, in the opposite direction to the propagation of the projection beam PB is thereby established. This gas flow 113 tends to be strongest in the center of the exit cone and therefore is not sufficient to impede passage of particulates and debris travelling close to the walls of the exit cone 95.

Therefore, according to the present embodiment, an inverted rotating foil trap 100 is provided in the exit cone upstream of the dynamic gas lock 110.

Inverted rotating foil trap comprises a plurality of vanes 101 projecting radially inwardly from a frustoconical support frame 103. Vanes 101 are thin and elongate. Vanes 101 are aligned so that their longitudinal axes are parallel to the optical axis OA so that they present the smallest possible cross-sectional area to the projection beam PB. Vanes 101 project into projection beam EB towards the optical axis OA but do not extend as far as the optical axis. In an embodiment a central core of the inverted rotating foil trap 100 is empty. The empty core desirably corresponds to the trajectories of particles that are effectively prevented from exiting the exit aperture 4221 by the dynamic gas lock 110. Although it is desirable that the core of inverted rotating foil trap is empty, in some embodiment cross bars or spokes may be provided to increase the strength or stiffness of the inverted rotating foil trap.

Inverted rotating foil trap 100 is driven to rotate by drive unit 102. The rate of rotation of inverted rotating foil trap 100 is determined with reference to its axial length and the spacing between vanes 101 so as to ensure that a particle travelling with a predetermined maximum particle speed cannot traverse the inverted rotating foil trap without being swept up by one of the vanes 101. To sweep up particles moving at a maximum speed of 500 ms$^{-1}$, with blades having a length of 50 mm in a direction parallel to optical axis OA and a maximum circumferential spacing of 10 mm, the linear speed (linear velocity) at the outer diameter of the inverted rotating foil trap must be greater than or equal to 100 ms$^{-1}$. For an outer diameter of about 0.3 m, this equates to a rotational speed of only about 100 Hz.

Because the purpose of the inverted rotating foil trap 100 is to trap particles travelling close to the edges of the exit cone, leaving the core of the rotating foil trap 100 empty ensures that the obstruction of desired radiation in projection beam PB is minimized. A fraction of the particles to be trapped travel in the space between the outer margins of the projection beam PB and the exit cone 95. Therefore, in addition to vanes 101a that project into the projection beam PB, inverted rotating foil trap 100 can be providing with additional vanes 101b which extend up to but not beyond the outer margin of projection beam PB. Since the spacing between the vanes is greatest at the periphery of the inverted rotating foil trap 100, provision of additional vanes 101b allows the speed of rotation of the inverted rotating foil trap 100 to be reduced whilst still capturing particles of the maximum speed. At the same time these additional blades do not obstruct any of the light of the projection beam PB. Additionally, of the vanes 101a which do intersect the projection beam PB, some vanes may be longer than others. Desirably, the number of vanes 101a that intersect a circle centered on the optical axis at a given radius decreases as that radius decreases. In an embodiment of the invention, the axial length of vanes 101 decreases towards the optical axis. For example, the vanes may have a triangular or trapezoid or trapezium shape in plan.

A variant of the embodiment of FIGS. 20 and 21 is shown in FIGS. 22 and 23. FIGS. 22 and 23 show parts of the rotating foil trap 100, other parts of this variant are the same as the embodiment of FIGS. 20 and 21. FIG. 22 is a partial perspective view. FIG. 23 shows how the vanes would look if a part of the foil trap were flattened. Whilst it is desirable that the parts of the vanes 101a that are within projection beam EB are aligned parallel to the optical axis OA in order to minimize absorption of radiation, this is not required of the parts of the vanes that are outside the projection beam EB. Thus, as shown in FIGS. 22 and 23, the variant provides inclined vanes 105 that are located outside the projection beam EB which are curved or angled relative to the optical axis OA.

The direction of curvature or inclination of the inclined vanes 105 is determined in relation to the direction of rotation of the inverted rotating foil trap 100 in order to direct debris or buffer gas in a desired direction, e.g. away from exit aperture 4221. The inclined vanes 105 located outside the projection beam EB can be arranged to support blades 101a that are within the projection beam EB at the points of intersection 106. Alternatively or in addition, separate supports for the vanes 101a can be provided.

In an embodiment of the invention, one or more of vanes 101 and/or inclined vanes 105 has a cross-section that is curved in a plane perpendicular to the optical axis of the projection beam PB. This curvature is arranged relative to the direction of the rotation of the inverted rotating foil trap so as to direct particles and other debris in a desired direction, e.g. towards the wall of the exit cone 95. It is desirable that particles and other debris not be directed towards either the collector CO or the exit aperture 4221.

It should be noted that the inverted rotating foil trap 100 of FIGS. 20 to 23 can be used for debris control in radiation sources or other apparatus having no other debris mitigation arrangements or different debris mitigation arrangements than described above. The inverted rotating foil trap can be placed at any convenient location on the source side of the intermediate focus.

Embodiments of the present invention can be employed with any form of plasma-based source using a fuel selected from the group consisting of Sn, Li, Gd, Tb and mixtures or combinations thereof. A fan unit as described above can also be employed in another module of the apparatus, such as the illumination system or projection system, in order to locally control or remove contamination.

The blades of a fan unit according to the present invention can be manufactured by fixing plates to a suitable frame or by additive manufacturing techniques such as laser sintering. The blades can be manufactured from a material selected from the groups consisting of Mo, W, Ti, Zr as well as mixtures and alloys thereof. The blades can be manufactured from other materials and provided with a coating of those materials. These materials provide desirable combinations of high strength; low weight and resistance to the buffer gas (e.g. H$_2$) and fuel (e.g. Sn). The same materials and techniques can be used to make the inverted rotating foil trap. In an embodiment of the invention, the number of blades N is greater than or equal to 50, desirably greater than or equal to 100, more desirably greater than or equal to 200.

In spite of the above and other methods of preventing particles emitted by the plasma propagating into the illuminator, it cannot be wholly eliminated that some particles do reach the illuminator. Detection and/or measurement of a particle flux are difficult. A technique known as particle imaging velocimetry (PIV) involves illuminating a region of space with a high-powered laser and taking a large number of images with a high resolution camera so that particle trajectories can be detected and measured. PIV however has several disadvantages. The equipment required for PIV requires a significant volume and is expensive. PIV has difficulty detecting the smallest and fastest particles and requires operation of the lithographic apparatus to be suspended for significant periods. Therefore, this technique is not suitable for detecting particles in the illuminator.

Other techniques for measuring particle flux into the illuminator include periodic measurement of the amount of contamination that has accumulated on mirrors of the illuminator, or the use of so-called witness wafers which are placed in the beam path to intercept particles. After a period of time, the witness wafer is removed, and the accumulation of particles thereon is measured. Both of these techniques have significant drawbacks that they cannot be used during production operation of the lithographic apparatus and they do not give information as to the variability of the particle flux; they can only give an average value for a long period of time. Also, the measurement of accumulated contamination over a period of time does not distinguish between sources of contamination. In particular, it is desirable to distinguish between high speed particles emitted from the plasma and travelling along ballistic trajectories, referred herein as ballistic particles, and other forms of contamination, referred to herein as environmental contamination. Ballistic particles present a risk of contamination of the patterning device whereas environmental contamination can more easily be prevented from reaching the patterning means.

Environmental contamination includes particles and vapors (molecular contaminants), of any origin, that move around the illuminator. Such particles may be propelled by a variety of effects, for example: gravity; electrophoresis (charge induced transport); drag force from flow of the low-pressure gas present in the illuminator; thermophoresis (flux based upon local temperatures differences, leading to a net movement towards the colder side); convective flow in the gas; and/or Brownian motion. The paths of environmental contaminants are therefore substantially random or flow-directed, with only short periods of substantially straight movement.

On the other hand, ballistic particles may have velocities of 100 ms$^{-1}$ or substantially more and hence have trajectories that are essentially straight. In the low-pressure environment of the illuminator, the motion of a ballistic particle is dominated by its momentum. The ultimate origin of ballistic particles is the plasma which is at a known and substantially constant location. Ballistic particles may make one or more collisions before entering the illuminator but the opening 4221 between the enclosing structure 4220 of the source collector apparatus SO and a vacuum chamber enclosing the illuminator EIL is small. Therefore, ballistic particles that enter the illuminator all appear to originate from a fairly small area and have trajectories within a relatively narrow angular range.

According to an embodiment of the present invention, a sensor device senses a) the accumulation of matter due to both ballistic particle flux and environmental contamination; and b) the accumulation of matter due only to environmental contamination using a shield to prevent the ballistic particle flux reaching the sensor device. The ballistic particle flux can be derived from the two measurements, e.g. by subtracting the measurement of environmental contamination, referred to as a reference signal, from the measurement of combined accumulation due to ballistic particle flux and environmental contamination, referred to as a sensor signal. The reference signal and sensor signals may be obtained using separate sensor units, one of which is open and the other of which is protected from the ballistic particle flux by the shield.

Alternatively, or in addition, a shield can take the form of a movable shutter so that the reference signal is obtained with the movable shutter in an open position that protects the sensor device from the ballistic particle flux and the sensor signal is obtained with the movable shutter in a closed position that does not protect the sensor device. The movable shutter can be driven by a shutter actuator to periodically switch between the open position and the closed position.

Figure 24:
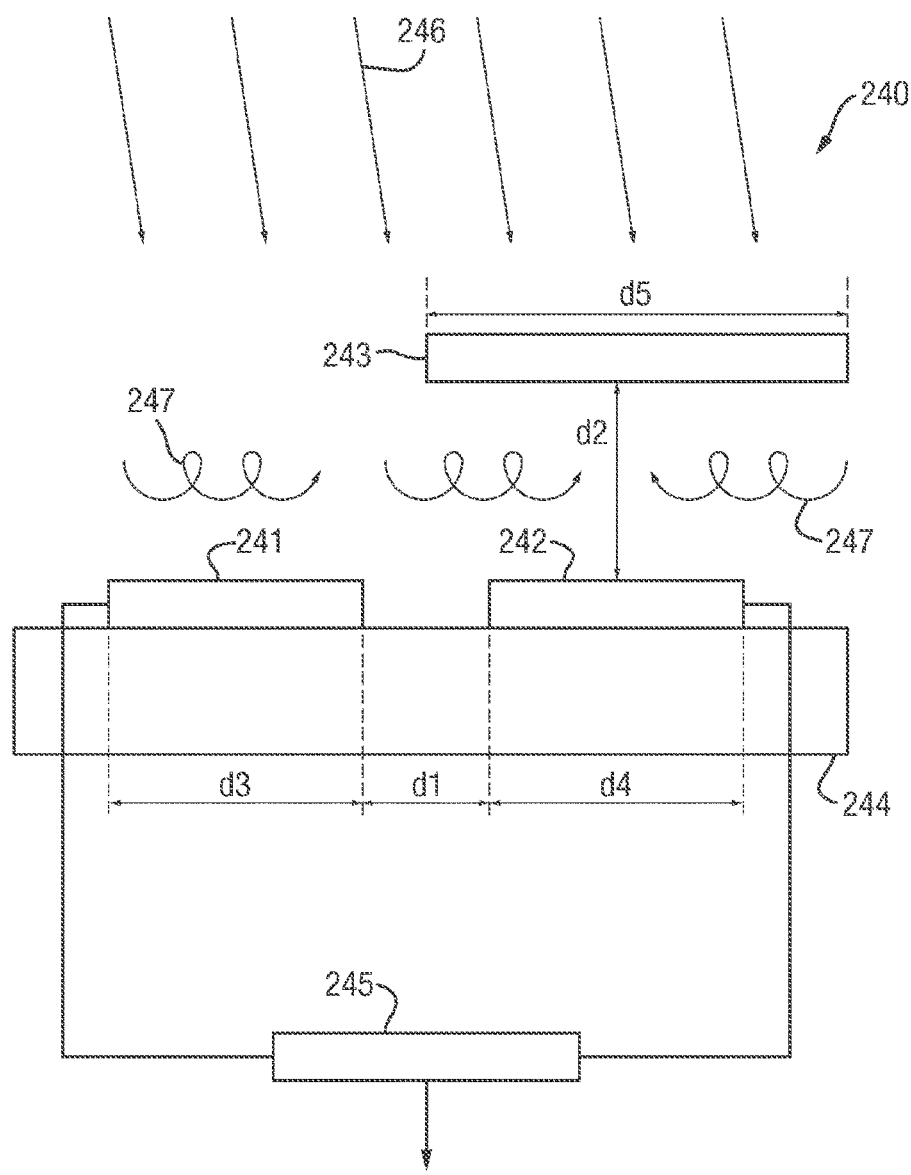
FIG. 24 depicts a sensor system according to an embodiment of the invention.

FIG. 24 depicts a sensor device according to an embodiment of the present invention. Sensor system 240 comprises a first sensor unit 241 and a second sensor unit 242 both mounted on sensor support member 244. First sensor 241 and second sensor 242 are configured so that they can measure the accumulation of material on a surface thereon. Several different types of sensor can be used for first sensor unit 241 and second sensor unit 242 as will be discussed further below.

A shield 243 is provided to prevent a flux of ballistic particles 246 reaching second sensor unit 242. Shield 243 is spaced apart from sensor 242 in the direction of the origin of ballistic particles 246 by a distance d2. Distance d2 is selected to be large enough not to substantially impede the flow of environmental contamination in the vicinity of sensor system 240. For example, d2 is large enough that contaminant deposition from the environmental contamination is not hindered significantly. The desirable minimum of d2 may depend on the effects driving movement of the environmental contamination in the vicinity of the sensor. The width d5 of shield 243 in a direction substantially perpendicular to the direction of incidence of the ballistic particles 246 is greater than the width d4 of the second sensor 242. Desirably, d5 is greater than d4 only by sufficient to ensure ballistic particles 246 do not reach second sensor 242 and no greater. The necessary width d5 to ensure shielding of second sensor 242 can be calculated based on the position of sensor system 240 relative to the origin of the ballistic particles and the range of trajectories of the ballistic particles.

First sensor 241 has a width d3 that is desirably equal to the width d4 of second sensor 242. First sensor 241 and second sensor 242 are separated by a distance d1. d1 is desirably as large as is necessary to ensure that second sensor 242 can be shielded from ballistic particles 246 by shield 243 and no larger, to ensure that first sensor 241 and second sensor 242 experience substantially the same rate of accumulation of environment contamination.

During use of the lithographic apparatus, ballistic particles 246 and environmental contamination 247 are incident on first sensor 241. First sensor 241 outputs a sensor signal indicative of the accumulation of matter thereon. Only environmental contamination 247 is incident on second sensor 242. Second sensor 242 outputs a reference signal indicative of the accumulation of matter thereon, that matter deriving substantially only from the environmental contaminants 247. A comparator 245 compares the sensor signal from first sensor 241 and the reference signal from second sensor 242 and outputs a flux signal indicative of the ballistic particle flux. In an embodiment, the first sensor 241 and second sensor 242 are substantially identical, including having the same area, so that the flux signal can be obtained by subtracting the reference signal from the sensor signal. In an alternative embodiment, the first sensor and the second sensor are different sizes and either or both of the sensor signal and the reference signal is multiplied by a scaling factor before the reference signal is subtracted from the sensor signal.

It should be noted that the sensor signal and the reference signal may be signals that are indicative of a total accumulation of material or a rate of accumulation of material. In the first case, the sensor signal and the reference signal can be differentiated to derive a signal indicative of the rate of accumulation. In the latter case the sensor signal and the reference signal may be integrated to provide a signal indicative of the total accumulation of material.

In an embodiment, it may not be possible, nor necessary, to reliably calibrate the sensor signal to derive therefrom an absolute measurement of the total ballistic particle flux into the illuminator. The total flux particles into the illuminator can be quite small and variable and the area of first sensor 241 can be quite small. The angular distribution of the ballistic particle flux may not be constant. Therefore, the accumulation of matter from ballistic particles may be variable and intermittent. However, even if an accurate measurement of the total particle flux cannot be obtained, the sensor signal can give a good indication of the accumulation of material in the illuminator over a short period thereby avoiding the need to periodically inspect the condition of elements of the illuminator for contamination. In addition, a sudden increase in the flux signal may be indicative of an event in the source collector that is generating an unusually high ballistic particle flux. The flux signal enables remedial action to be taken to prevent further contamination of the optical elements of the illuminator in such an event. Remedial action may, for example, involve adjusting a parameter of the source or stopping operation of the apparatus. In an embodiment of the present invention, the flux signal is recorded periodically and can be used after the event to assist in analysis of the origin of contamination.

Shield 243 can be made from a wide variety of materials that are vacuum compatible, for example: metals such as stainless steel or aluminum; ceramics, or semiconductors. Depending on the position of sensor signal 240 within the illuminator it may be desirable that shield 243 be capable of withstanding elevated temperatures. Shield 243 can be supported by any convenient arrangement, e.g. one or more small brackets or pillars. Shield 243 should not experience any significant load in use other than its own weight and is not required to be positioned with great accuracy.

Sensor support member 244 is desirably formed of a material with a high thermal conductivity, for example a metal such as copper or stainless steel. A high thermal conductivity is desirable so that first sensor 241 and second sensor 242 are maintained at a substantially equal temperature. Thereby, any temperature dependence of first sensor 241 and second sensor 242 can be eliminated through comparison of the measurement signal and the reference signal. If sensor system 240 is positioned within or close to projection beam B it may receive a significant heat load in the form of infrared radiation and EUV radiation. Since the ballistic particles 246 have an apparent origin near the intermediate focus IF of the projection beam, shield 243 will shield second sensor 242 from EUV radiation of the projection beam and infrared radiation if sensor system 240 is within the projection beam B. This could result in a temperature difference between first sensor 241 and second sensor 242. Therefore in that case a high thermal conductivity of sensor support 244 to minimize any temperature difference is particularly desirable. In an embodiment, shield 243 is made of a material, e.g. silicon, that is transparent to infrared radiation in order to reduce the difference in heat load between first sensor 241 and second sensor 242.

As mentioned above, a variety of different types of sensor can be used as first sensor 241 and second sensor 242. In particular, resonance sensors, such as quartz microbalances or piezoelectric sensors can be used. A quartz crystal microbalance comprises a quartz crystal having a measurement surface exposed to accumulation of material to be measured, in the present case the ballistic particle flux and/or the environmental contamination. The mechanical resonance frequency of the quartz crystal is measured and changes in the resonance frequency can be used to determine the amount of mass that has accumulated on the measurement surface. A quartz crystal microbalance can measure a mass density down to about 1 $\mu gcm^{-2}$. Thus, in an embodiment of the present invention, for example using a quartz microbalance, it is possible to measure low levels of particle flux with a high time resolution, e.g. about 1 hertz. Other forms of piezoelectric balance using other piezoelectric materials can also be used.

Figure 25:
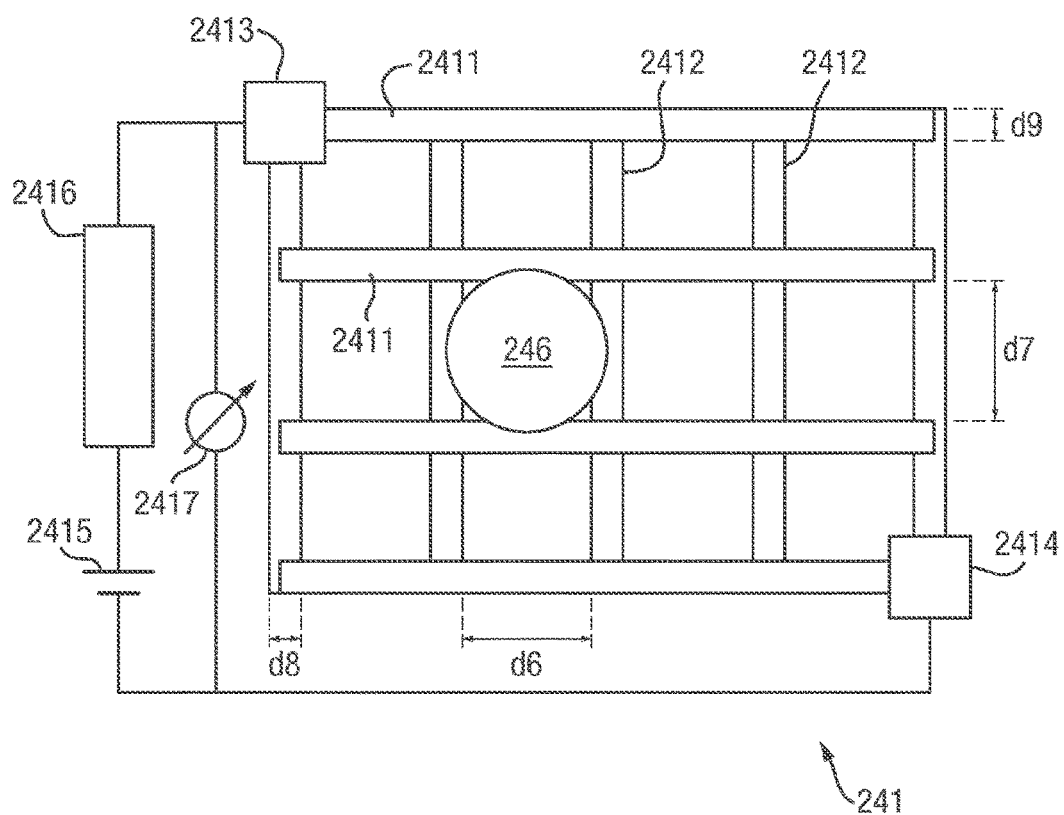
FIG. 25 depicts a sensor device according to an embodiment of the invention.

Other forms of sensor that can be used for first sensor 241 and second sensor 242 include resistance-based sensors, an example of which is depicted in FIG. 25. The sensor of FIG. 25 comprises a conductive grid exposed to accumulation of matter. The conductive grid comprises row conductors 2411 having a width d9 and a spacing d7 which are interconnected with column conductors 2412 having a width d8 and a spacing d6. In an embodiment the widths d8 and d9 are greater than or equal to 5 nm. In an embodiment, the widths d8 and d9 are less than or equal to 50 nm, desirably less than or equal to 20 nm; the functioning of the sensor does not depend on an exact width for the conductors, however narrow conductors may provide higher sensitivity. In an embodiment first sensor 241 and second sensor 242 comprise an array of conductive grids. The spacings d6, d7 are selected based on the expected particle size so as to be slightly smaller than the average expected particle size in the ballistic particle flux. Spacings d6 and d7 may be in the range of from 20 nm to 100 nm. It should be noted that for illustrative purposes only a few rows and columns are shown in the conductive grid; a practical embodiment may have many thousands of row conductors and column conductors and a total area of several square centimeters. The conductive grid can be manufactured on a suitable substrate, e.g. of silicon, by lithographic techniques.

The conductor grid has terminals 2413, 2414 which are used to connect it to a series circuit of a power supply 2415 and a reference resistor 2416. A voltmeter 2417 measures the voltage across the conducting grid. In use, if a particle 246 lands on the grid, whether from the environmental contamination or the ballistic particle flux, it will change the effective resistance of the grid which can be detected through a change in the voltage measured by voltmeter 2417.

Variations on this form of sensor are possible. For example, the conductive grid can be arranged so that the row conductors are connected to each other and the column conductors are connected to each other but the row of conductors are isolated from the column conductors. A particle 246 may then effect a greater resistance change by bridging between row and column conductors. Similarly, the conductors may have non-conductive gaps so that contamination bridges the non-conductive gaps and lowers the resistance of the conductive grid. A Wheatstone bridge can be used to measure the resistance of the conductive grid. The conductive grids of the first sensor and the second sensor can be included in a single bridge circuit to directly measure the difference in resistance between the two conductive grids.

A similar form of sensor can be constructed based on capacitive principles. A capacitive sensor may comprise a grid of conductive pads. Desirably, the conductive pads have a pitch, i.e. center to center distance, that is comparable to or smaller than the size of the particles that are expected to accumulate thereon. Alternate pads are connected to each other to form intertwined capacitor plates. By analogy to a chess board, the black squares are connected together but insulated from the white squares and vice versa. The sensor further comprises an insulating layer, e.g. a passivation layer, above the conductive pads. A debris particle, especially of conductive material, on the insulating layer will measurably alter the capacitance of the sensor.

Other forms of sensor may be usable depending upon the nature of the ballistic particles and environmental contamination to be measured. For example when the ballistic particles and environmental contamination are tin, a sensor based on a ruthenium layer can be used. The ruthenium layer reacts with tin to change its resistance in a way which can be detected.

The above types of sensor will gradually accumulate material, but can provide a relatively frequent measurement of the amount accumulated. It is therefore possible to provide a real time measurement of the rate of accumulation of material with a temporal resolution in the range of, for example, about 0.1 Hz to 10 Hz. A sensor which continuously accumulates material may have a limited life span in that its accuracy may deteriorate or it may cease to function entirely once a certain amount of material has been accumulated. In that case, the sensor can be replaced or cleaned, e.g. during routine maintenance of the lithographic apparatus. A sensor according to an embodiment of the invention is relatively inexpensive and does not require to be accurately placed or calibrated. Therefore its replacement is economic and will not significantly increase downtime of the lithographic apparatus for maintenance.

The lithographic apparatus may be provided with measures, e.g. the use of a low pressure H gas, to clean optical elements in the illuminator. Such cleaning measures can also be effective to clean first sensor 241 and second sensor 242. This may obviate or reduce the need for periodic replacement of the sensors. If the cleaning is periodic then the measurement signal and reference signals may need to be effectively reset at the end of a cleaning process. With a continuous cleaning process, the flux signal can be used to measure the effectiveness of the cleaning process.

Sensor system 240 can be located at any convenient position within the illuminator. Multiple sensor systems 240 can be provided in the illuminator since they are inexpensive. One or more sensor systems 240 can be provided close to the intermediate focus, in the entrance to the illuminator. It is desirable to position a sensor system 240 close to but just outside the light cone of the projection beam EB in order to provide the best possible measurement of particle flux without reducing the amount of radiation that can be used to expose the substrate. One or more sensor systems 240 can also be usefully be placed adjacent the optical elements of the illuminator in order to provide the best measurement of accumulation onto each optical element.

Debris mitigation measures in the source-collector module may cast shadows into the illuminator, i.e. regions of the illuminator in which the ballistic particle flux is low or zero. It is desirable to position sensor system 240 in a location that is not in such a shadow.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. In the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions, below atmospheric pressure conditions or ambient (non-vacuum) conditions.

While specific embodiments of the invention have been described above, it will be appreciated that the invention, at least in the form of a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as discussed above, or a data storage medium (e.g. semi-conductor memory, magnetic or optical disk) having such a computer program stored therein. Further, the machine-readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing and sending signals. One or more processors are configured to communicate with at least one of the controllers. For example, each controller may include one or more processors for executing the computer programs that include machine-readable instructions for the methods of operating an apparatus as described above. The controllers may include data storage media for storing such computer programs, and/or hardware to receive such media. So the controller(s) may operate according to the machine-readable instructions of one or more computer programs.

An embodiment of the invention may be applied to substrates with a width (e.g., diameter) of 300 mm or 450 mm or any other size.

The descriptions above are intended to be illustrative, not limiting. Thus, it will be apparent to one skilled in the art that modifications may be made to the invention as described without departing from the scope of the claims and clauses set out below.

CLAUSES

1. A radiation source device, the device comprising:
    a source chamber having an exit aperture;
    a fuel source unit configured to provide fuel to the source chamber;
    an excitation unit configured to excite the fuel to form a plasma;
    a collector configured to collect at least radiation of a desired wavelength emitted by the plasma and to direct the collected radiation beam along a beam path out of the exit aperture of the source chamber;
    a buffer gas unit configured to supply buffer gas to the source chamber; and
    a fan unit located outside the beam path and configured to generate a flow of the buffer gas away from the collector and/or the exit aperture.

2. A device according to clause 1, wherein the fan unit comprises at least one blade.

3. A device according to clause 2, wherein the fan unit comprises a blade assembly having a plurality of blades mounted in an annular arrangement and rotatable about an optical axis of the beam path.

4. A device according to clause 2 or clause 3, wherein the or each blade is substantially planar.

5. A device according to clause 2 or clause 3, wherein the or each blade is curved.

6. A device according to clause 5, wherein the number and curvature of the blades is selected such that there is no straight path from the optical axis through the fan unit.

7. A device according to clause 5 or clause 6, wherein the curvature of the blades is selected such that an imaginary line extending from the optical axis and perpendicular thereto to a given point on a blade intersects the blade at an angle of greater than 45 degrees to a normal to the surface of the blade.

8. A device according to any of clauses 3 to 7, wherein the fan unit comprises a plurality of concentric blade assemblies.

9. A device according to clause 8, wherein the fan unit comprises a drive unit arranged to rotate adjacent ones of the concentric blade assemblies with different angular velocities.

10. A device according to any of clauses 2 to 9, wherein
the collector is configured to direct the radiation to an intermediate focus near the exit aperture; and
each blade is configured such that all straight lines between a predetermined section of a distal edge of the blade, the distal edge being the edge closest to the beam path, and the intermediate focus are obstructed.

11. A device according to clause 10, wherein the predetermined section of the distal edge includes all parts of the edge at which a particle incident thereon directly from the plasma is deflected onto a trajectory aimed at the exit aperture.

12. A device according to clause 10, wherein the predetermined section includes the whole of the distal edge.

13. A device according to clause 10, clause 11 or clause 12, further comprising an annular blocking member located between the fan unit and the intermediate focus and configured so as to obstruct at least one straight line between at least a part of the distal edge and the intermediate focus.

14. A device according to any of clauses 10 to 13, wherein the source chamber comprises a wall and a part of the wall is configured so as to obstruct at least one straight line between at least a part of the distal edge and the intermediate focus.

15. A device according to any of clauses 10 to 14, wherein the intermediate focus is outside the source chamber and the exit aperture is configured so as to obstruct at least one straight line between at least a part of the distal edge and the intermediate focus.

16. A device according to any of clauses 1 to 15, wherein the fan unit comprises a drive unit arranged to drive the fan unit so that a part of a blade thereof has a linear velocity greater than 100 ms$^{-1}$.

17. A device according to any of clauses 1 to 16, wherein the fan unit comprises a drive unit arranged to drive the fan unit so that a blade thereof has a rotational velocity in the range of from 50 to 200 Hz, desirably 70 to 100 Hz.

18. A device according to any of clauses 1 to 17, wherein the fan unit comprises a non-contact bearing arranged to rotatably support a blade thereof.

19. A device according to any of clauses 1 to 18, wherein the or each blade is made from a material selected from the group consisting of Mo, W, Ti, Zr, as well as mixtures and alloys thereof.

20. A device according to any clauses 1 to 19, wherein the or each blade has a surface coating made from a material selected from the group consisting of Mo, W, Ti, Zr, as well as mixtures and alloys thereof.

21. A device according to any clauses 1 to 20, wherein the fan unit further comprises a heating unit arranged to heat the or each blade to a temperature greater than a melting point of the fuel.

22. A device according to any of clauses 1 to 21, further comprising a particle trap located between the fan unit and the exit aperture, the particle trap comprising a set of vanes, wherein:
at least a part of each vane lies within the beam path,
the part of each vane is elongate and has a longitudinal axis substantially parallel to an optical axis of the beam path, and
the part of each vane extends towards but does not reach the optical axis.

23. A device according to clause 22, wherein a second part of each vane lies outside the beam path.

24. A device according to clause 22 or clause 23, wherein the at least one vane extends a different distance towards the optical axis than another vane cone.

25. A device according to any of clauses 22 to 24, wherein the particle trap further comprises drive means arranged to drive the set of vanes to rotate about a rotational axis, the rotational axis being substantially coincident with the optical axis.

26. A device according to any of clauses 22 to 25, wherein the particle trap further comprises a second set of vanes, the vanes of the second set being wholly outside the beam path.

27. A device according to clause 26, wherein the vanes of the second set are curved or inclined to the optical axis.

28. A radiation source device, the device comprising:
a source chamber having an exit aperture;
a fuel source unit configured to provide fuel to the source chamber;
an excitation unit configured to excite the fuel to form a plasma;
a collector configured to collect at least radiation of a desired wavelength emitted by the plasma and to direct the collected radiation beam along a beam path out of the exit aperture of the source chamber; and a particle trap located between collector and the exit aperture, the particle trap comprising a set of vanes, wherein:
at least a part of each vane lies within the beam path,
the part of each vane lies is elongate and has a longitudinal axis substantially parallel to an optical axis of the beam path, and
the part of each vane extends towards but does not reach the optical axis.

29. A lithographic tool comprising:
a radiation source device according to any of clauses 1 to 28; and
an optical system configured to direct radiation emitted by the radiation source onto an object.

30. A lithographic tool according to clause 29, wherein the optical system comprises an illumination system arranged to direct radiation emitted by the radiation source onto a patterning device; and the tool further comprises:
a support system arranged to support a patterning device;
a projection system arranged to direct radiation patterned by the patterning device onto a substrate; and
a substrate holder arranged to support a substrate.

31. A device manufacturing method comprising:
exciting a fuel to form a plasma;
collecting radiation emitted by the plasma and directing it into a beam;
directing the beam onto a patterning device;
directing the beam patterned by the patterning device onto a substrate;

supplying a buffer gas to a chamber containing the plasma; and operating a fan located outside the beam path to generate a flow of the buffer gas out of the beam.

32. A device manufacturing method according to clause 31, further comprising heating a blade of the fan to a temperature higher than the melting point of the fuel.

33. A device manufacturing method according to clause 32, wherein the heating is performed intermittently.

34. A sensor system for measuring a ballistic particle flux, the sensor system comprising:

a sensor device configured to measure ballistic particles and environmental contamination incident thereon; and a shield configured to selectively prevent the ballistic particle flux reaching the sensor device but allow the environmental contamination to reach the sensor device.

35. A sensor system according to clause 34, wherein the sensor device comprises:

a first sensor unit open to receive the ballistic particle flux and the environmental contamination; and a second sensor unit protected by the shield so as not to receive the ballistic particle flux but only the environmental contamination.

36. A sensor system according to clause 35, wherein the shield comprises a plate spaced apart from the second sensor in a direction of a source of the ballistic particle flux.

37. A sensor system according to clause 35 or clause 36, further comprising a heat-conductive substrate; and wherein both the first sensor and the second sensors are in thermal contact with the heat-conductive substrate.

38. A sensor system according to clause 35, clause 36 or clause 37, wherein the first sensor and the second sensor each comprise a resonance sensor, such as a quartz microbalance or a piezoelectric sensor.

39. A sensor system according to clause 35, clause 36 or clause 37, wherein the first sensor and the second sensor each comprise a resistive sensor or a capacitive sensor.

40. A sensor system according to any of clauses 35 to 39, wherein the first sensor and the second sensor are substantially identical.

41. A sensor system according to clause 34, wherein the shield comprises a movable shutter and a shutter actuator configured to move the shutter between an open position in which the shutter does not prevent the ballistic particle flux reaching the sensor device and a closed position in which the shutter does prevent the ballistic particle flux reaching the sensor device.

42. A lithographic tool comprising:

a radiation source device configured to emit radiation;

an optical system configured to direct radiation emitted by the radiation source onto an object; and a sensor system according to any of clauses 34 to 41.

43. A lithographic tool according to clause 42, further comprising an optics chamber accommodating the optical system; wherein the sensor system is located in the optics chamber.

44. A lithographic tool according to clause 42 or 43, wherein the sensor system is located at a position such that the radiation emitted by the radiation source is not incident thereon.

45. A lithographic tool according to clause 42, 43 or 44, comprising a plurality of sensor systems according to any one of clauses 34 to 41.

46. A lithographic tool according to any one of clauses 42 to 45, wherein the radiation source is according to any one of clauses 1 to 28.

47. A method of sensing a ballistic particle flux in a place subject to environmental contamination, the method comprising:

generating a sensor signal indicative of accumulation on a sensor device of matter deriving from the ballistic particle flux and the environmental contamination;

generating a reference signal indicative of accumulation on the sensor device of matter deriving from environmental contamination but not the ballistic particle flux; and obtaining a value indicative of the ballistic particle flux from the sensor signal and the reference signal.

The invention claimed is:

1. A sensor system for measuring a ballistic particle flux, the sensor system comprising:

a sensor device configured to measure ballistic particles and environmental contamination incident thereon; and a shield configured to selectively prevent the ballistic particle flux reaching the sensor device but to allow the environmental contamination to reach the sensor device.

2. The sensor system according to claim 1, wherein the sensor device comprises:

a first sensor unit open to receive the ballistic particle flux and the environmental contamination; and a second sensor unit protected by the shield so as not to receive the ballistic particle flux but only the environmental contamination.

3. The sensor system according to claim 2, wherein the shield comprises a plate spaced apart from the second sensor unit in a direction of a source of the ballistic particle flux.

4. The sensor system according to claim 2, further comprising a heat-conductive substrate, wherein both the first and second sensor units are in thermal contact with the heat-conductive substrate.

5. The sensor system according to claim 2, wherein the first and second units each comprise a resonance sensor.

6. The sensor system according to claim 2, wherein the first and second sensor units each comprise a resistive sensor or a capacitive sensor.

7. The sensor system according to claim 2, wherein the first sensor unit is substantially identical to the second sensor unit.

8. The sensor system according to claim 1, wherein the shield comprises a movable shutter and a shutter actuator configured to move the shutter between an open position in which the shutter does not prevent the ballistic particle flux reaching the sensor device and a closed position in which the shutter does prevent the ballistic particle flux reaching the sensor device.

9. A lithographic tool comprising:

an optical system configured to direct radiation emitted by a radiation source onto an object; and the sensor system according to claim 1.

10. The lithographic tool according to claim 9, further comprising an optics chamber accommodating the optical system, wherein the sensor system is located in the optics chamber.

11. The lithographic tool according to claim 9, wherein the sensor system is located at a position such that the radiation emitted by the radiation source is not incident thereon.

12. The lithographic tool according to claim 9, comprising a plurality of instances of the sensor system.

13. A method of sensing a ballistic particle flux in a place subject to environmental contamination, the method comprising:

generating a sensor signal indicative of accumulation on a sensor device of matter deriving from the ballistic particle flux and the environmental contamination;

generating a reference signal indicative of accumulation on the sensor device of matter deriving from environmental contamination but not the ballistic particle flux; and obtaining a value indicative of the ballistic particle flux from the sensor signal and the reference signal.

14. The method according to claim 13, wherein the sensor device comprises:

a first sensor unit open to receive the ballistic particle flux and the environmental contamination and configured to generate the sensor signal; and a second sensor unit protected by a shield so as not to receive the ballistic particle flux but only the environmental contamination and configured to generate the reference signal.

15. A sensor system for measuring a ballistic particle flux, the sensor system comprising:

a first sensor unit configured to generate a sensor signal indicative of accumulation on the first sensor unit of matter deriving from the ballistic particle flux and from environmental contamination;

a second sensor unit configured to generate a reference signal indicative of accumulation on the second sensor unit of matter deriving from environmental contamination but not the ballistic particle flux; and a processor system configured to obtain a value indicative of the ballistic particle flux from the sensor signal and the reference signal.

16. The sensor system according to claim 15, further comprising a heat-conductive substrate, wherein both the first and second sensor units are in thermal contact with the heat-conductive substrate.

17. The sensor system according to claim 15, wherein the first and second units each comprise a resonance sensor.

18. The sensor system according to claim 15, wherein the first and second sensor units each comprise a resistive sensor or a capacitive sensor.

19. The sensor system according to claim 15, wherein the first sensor unit is substantially identical to the second sensor unit.

20. A lithographic tool comprising:

an optical system configured to direct radiation emitted by a radiation source onto an object; and the sensor system according to claim 15.

* * * * *